(12) United States Patent
Afrasiabi

(10) Patent No.: US 11,900,534 B2
(45) Date of Patent: *Feb. 13, 2024

(54) SYSTEMS AND METHODS FOR SYNTHETIC IMAGE GENERATION

(71) Applicant: The Boeing Company, Chicago, IL (US)

(72) Inventor: Amir Afrasiabi, University Place, WA (US)

(73) Assignee: The Boeing Company, Arlington, VA (US)

( * ) Notice: Subject to any disclaimer, the term of this patent is extended or adjusted under 35 U.S.C. 154(b) by 188 days.

This patent is subject to a terminal disclaimer.

(21) Appl. No.: 17/444,123

(22) Filed: Jul. 30, 2021

(65) Prior Publication Data

US 2023/0043409 A1 Feb. 9, 2023

(51) Int. Cl.
| | |
|---|---|
| *G06T 17/00* | (2006.01) |
| *G06N 3/088* | (2023.01) |
| *G06F 30/27* | (2020.01) |
| *G06N 3/045* | (2023.01) |

(52) U.S. Cl.
CPC .............. *G06T 17/00* (2013.01); *G06F 30/27* (2020.01); *G06N 3/045* (2023.01); *G06N 3/088* (2013.01)

(58) Field of Classification Search
CPC ......... G06T 17/00; G06T 19/00; G06T 15/04; G06F 30/27; G06F 30/12; G06N 3/045; G06N 3/088; G06N 3/02; G06K 9/6257
See application file for complete search history.

(56) References Cited

U.S. PATENT DOCUMENTS

| | | | | |
|---|---|---|---|---|
| 10,210,631 B1* | 2/2019 | Cinnamon | ............ | G06T 15/503 |
| 10,459,444 B1* | 10/2019 | Kentley-Klay | ...... | G05D 1/0027 |
| 10,496,809 B1* | 12/2019 | Pham | ..................... | G06N 20/00 |

(Continued)

FOREIGN PATENT DOCUMENTS

EP 3792827 A1 3/2021

OTHER PUBLICATIONS

"Unpaired Image-to-Image Translation Using a Generative Adversarial Network (GAN)," U.S. Appl. No. 63/125,350, filed Dec. 14, 2020, 54 pages.

(Continued)

*Primary Examiner* — Charles L Beard
(74) *Attorney, Agent, or Firm* — Alleman Hall Creasman & Tuttle LLP

(57) ABSTRACT

An image generation system is provided to: receive a 3D CAD (computer aided design) model comprising 3D model images of a target object; based on the 3D CAD model of the target object, generate augmented CAD models of the target object comprising data sets, each data set respectively corresponding to an associated one of a plurality of attribute classes, each data set comprising a plurality of 2D model images; input the data sets into a generative adversarial network comprising generators respectively corresponding to the plurality of attribute classes and discriminators respectively corresponding to the generators; generate synthetic photorealistic images of the target object using the generators, the synthetic photorealistic images including attributes in accordance with the data sets corresponding to the plurality of attribute classes; and output the synthetic photorealistic images of the target object.

20 Claims, 8 Drawing Sheets

(56) References Cited

U.S. PATENT DOCUMENTS

| | | | |
|---|---|---|---|
| 10,643,329 B2 | 5/2020 | Afrasiabi et al. | |
| 10,956,808 B1* | 3/2021 | Bhardwaj | G06N 3/045 |
| 10,957,017 B1* | 3/2021 | Minor | G06T 3/4076 |
| 11,055,872 B1* | 7/2021 | Chen | G06V 10/764 |
| 11,126,891 B2* | 9/2021 | St. Romain, II | G06F 18/2148 |
| 11,238,197 B1* | 2/2022 | Douglas | G16H 20/40 |
| 11,263,487 B2* | 3/2022 | Li | G06F 18/217 |
| 11,308,576 B2* | 4/2022 | Yuan | G06T 3/0012 |
| 11,341,699 B1* | 5/2022 | Gottlieb | G06N 20/00 |
| 11,562,597 B1* | 1/2023 | Kim | G06V 20/653 |
| 11,610,098 B2* | 3/2023 | Dong | G06N 20/00 |
| 11,620,774 B2* | 4/2023 | Hwang | G06T 11/001 |
| | | | 382/159 |
| 11,645,836 B1* | 5/2023 | Manevitz | G06N 3/08 |
| | | | 382/156 |
| 11,677,897 B2* | 6/2023 | Zhao | G06V 10/82 |
| | | | 382/156 |
| 2009/0274386 A1 | 11/2009 | Panetta et al. | |
| 2012/0189178 A1* | 7/2012 | Seong | G06T 19/00 |
| | | | 382/128 |
| 2016/0085426 A1* | 3/2016 | Scott | G06F 3/04812 |
| | | | 715/708 |
| 2017/0301078 A1 | 10/2017 | Forutanpour et al. | |
| 2017/0357895 A1* | 12/2017 | Karlinsky | G06V 10/764 |
| 2017/0372480 A1* | 12/2017 | Anand | G06T 7/11 |
| 2018/0129865 A1* | 5/2018 | Zia | G06T 15/40 |
| 2018/0129910 A1* | 5/2018 | Zia | H04N 7/00 |
| 2018/0130229 A1* | 5/2018 | Zia | G06V 10/82 |
| 2018/0130355 A1* | 5/2018 | Zia | G06V 10/772 |
| 2018/0330205 A1* | 11/2018 | Wu | G06N 3/02 |
| 2018/0336471 A1* | 11/2018 | Rezagholizadeh | G06N 3/047 |
| 2018/0336741 A1 | 11/2018 | Rezagholizadeh et al. | |
| 2018/0349527 A1* | 12/2018 | Li | G06N 3/08 |
| 2019/0056715 A1* | 2/2019 | Subramaniyan | G05B 19/4099 |
| 2019/0087730 A1* | 3/2019 | Saito | G06N 3/088 |
| 2019/0118497 A1 | 4/2019 | Kierbel et al. | |
| 2019/0130221 A1* | 5/2019 | Bose | G06N 3/045 |
| 2019/0130603 A1* | 5/2019 | Sun | G06N 3/045 |
| 2019/0164007 A1* | 5/2019 | Liu | G06F 18/2413 |
| 2019/0295302 A1* | 9/2019 | Fu | G06V 10/82 |
| 2019/0311469 A1* | 10/2019 | Afrasiabi | G06T 7/001 |
| 2019/0325574 A1* | 10/2019 | Jin | G06V 10/454 |
| 2019/0354804 A1* | 11/2019 | Ros Sanchez | G06F 18/2148 |
| 2019/0370666 A1* | 12/2019 | Ros Sanchez | G06N 3/088 |
| 2019/0391562 A1* | 12/2019 | Srivastava | B23Q 15/04 |
| 2020/0068398 A1* | 2/2020 | Chakraborty | H04W 12/79 |
| 2020/0074674 A1* | 3/2020 | Guo | G06F 18/217 |
| 2020/0097757 A1* | 3/2020 | Min | G06V 10/764 |
| 2020/0134446 A1* | 4/2020 | Soni | G06N 3/08 |
| 2020/0134494 A1* | 4/2020 | Venkatadri | G06N 3/047 |
| 2020/0151938 A1* | 5/2020 | Shechtman | G06N 3/045 |
| 2020/0167161 A1* | 5/2020 | Planche | G06F 9/328 |
| 2020/0175329 A1* | 6/2020 | Malaya | G06V 10/774 |
| 2020/0175669 A1 | 6/2020 | Bian et al. | |
| 2020/0210779 A1* | 7/2020 | Atsmon | G06T 7/55 |
| 2020/0293828 A1* | 9/2020 | Wang | G06V 20/647 |
| 2020/0294201 A1* | 9/2020 | Planche | G06F 18/2413 |
| 2020/0311482 A1* | 10/2020 | Soni | G06V 10/454 |
| 2020/0311913 A1* | 10/2020 | Soni | G06V 10/7784 |
| 2020/0368815 A1* | 11/2020 | Baker | B33Y 40/00 |
| 2020/0388017 A1 | 12/2020 | Coffman | |
| 2020/0393562 A1* | 12/2020 | Staudinger | G01S 13/933 |
| 2021/0012093 A1* | 1/2021 | Rao | G06T 9/002 |
| 2021/0027044 A1* | 1/2021 | Lee | G06V 20/13 |
| 2021/0027107 A1* | 1/2021 | Pekelny | G06N 3/045 |
| 2021/0034961 A1 | 2/2021 | Lovell et al. | |
| 2021/0086355 A1* | 3/2021 | Park | G06V 10/774 |
| 2021/0097148 A1* | 4/2021 | Bagschik | G06F 30/15 |
| 2021/0097691 A1* | 4/2021 | Liu | G06V 10/764 |
| 2021/0117774 A1* | 4/2021 | Choi | G06N 3/045 |
| 2021/0192762 A1* | 6/2021 | Guan | G06V 20/64 |
| 2021/0201075 A1* | 7/2021 | Pahde | G06T 17/20 |
| 2021/0201078 A1* | 7/2021 | Yao | G06T 1/20 |
| 2021/0232858 A1* | 7/2021 | Mukherjee | G06T 7/70 |
| 2021/0232926 A1* | 7/2021 | Hutter | G06V 10/764 |
| 2021/0241521 A1* | 8/2021 | Zhe | G06V 10/82 |
| 2021/0264205 A1* | 8/2021 | Ge | G06F 18/2415 |
| 2021/0271019 A1 | 9/2021 | Laffont et al. | |
| 2021/0271591 A1* | 9/2021 | Trost | G06N 3/047 |
| 2021/0276587 A1* | 9/2021 | Urtasun | G06N 3/08 |
| 2021/0286923 A1* | 9/2021 | Kristensen | G01S 7/412 |
| 2021/0286925 A1* | 9/2021 | Wyrwas | G06F 11/0739 |
| 2021/0287050 A1* | 9/2021 | Kar | G06V 10/774 |
| 2021/0287780 A1* | 9/2021 | Korani | G06N 3/08 |
| 2021/0312242 A1* | 10/2021 | Jafarkhani | G06N 3/08 |
| 2021/0312634 A1* | 10/2021 | Plawinski | G06T 5/002 |
| 2021/0325895 A1* | 10/2021 | Huai | G06F 18/217 |
| 2021/0358164 A1* | 11/2021 | Liu | G06V 10/764 |
| 2021/0374402 A1* | 12/2021 | Kim | G06N 3/084 |
| 2021/0374756 A1* | 12/2021 | Pandey | G06N 3/08 |
| 2021/0383527 A1* | 12/2021 | Malaya | G06N 3/088 |
| 2021/0383616 A1* | 12/2021 | Rong | G06T 19/20 |
| 2021/0397142 A1* | 12/2021 | Lovell | G06N 3/006 |
| 2022/0005175 A1 | 1/2022 | Mansell | |
| 2022/0012596 A1* | 1/2022 | Nie | G06T 11/60 |
| 2022/0012815 A1* | 1/2022 | Kearney | G16H 50/70 |
| 2022/0012859 A1* | 1/2022 | Zhao | G06N 3/045 |
| 2022/0020184 A1* | 1/2022 | Rijken | A61B 6/502 |
| 2022/0035961 A1* | 2/2022 | Ziabari | G06N 3/045 |
| 2022/0044074 A1* | 2/2022 | Li | G06T 7/70 |
| 2022/0051479 A1* | 2/2022 | Agarwal | G06N 3/045 |
| 2022/0058880 A1* | 2/2022 | Bondich | G06V 10/82 |
| 2022/0067451 A1* | 3/2022 | Wang | G06V 30/194 |
| 2022/0076067 A1* | 3/2022 | Marie-Nelly | G06V 10/60 |
| 2022/0083807 A1* | 3/2022 | Zhang | G06T 11/60 |
| 2022/0083872 A1* | 3/2022 | Mugan | G06N 3/047 |
| 2022/0084173 A1* | 3/2022 | Liang | G06T 5/50 |
| 2022/0084204 A1* | 3/2022 | Li | G06N 3/08 |
| 2022/0084220 A1* | 3/2022 | Pillai | G06T 7/30 |
| 2022/0091593 A1* | 3/2022 | Neilan | B64G 1/66 |
| 2022/0101104 A1* | 3/2022 | Chai | G06T 11/00 |
| 2022/0108417 A1* | 4/2022 | Liu | G06T 1/0007 |
| 2022/0108436 A1* | 4/2022 | Kang | G06T 7/0008 |
| 2022/0114698 A1* | 4/2022 | Liu | G06T 7/11 |
| 2022/0138506 A1* | 5/2022 | Elenes | G06V 10/82 |
| | | | 382/157 |
| 2022/0141422 A1* | 5/2022 | Bathiche | G06V 40/171 |
| | | | 345/633 |
| 2022/0156525 A1* | 5/2022 | Guizilini | G06F 18/2148 |
| 2022/0180203 A1* | 6/2022 | Zhou | G06N 3/088 |
| 2022/0180447 A1* | 6/2022 | Kearney | G06V 30/413 |
| 2022/0180595 A1* | 6/2022 | Bethi | G06T 15/005 |
| 2022/0180602 A1* | 6/2022 | Hao | G06T 11/00 |
| 2022/0188978 A1* | 6/2022 | Hu | G06T 11/008 |
| 2022/0189145 A1* | 6/2022 | Evans | G06V 10/776 |
| 2022/0198339 A1* | 6/2022 | Zhao | G06F 18/214 |
| 2022/0198609 A1* | 6/2022 | Carbune | G06T 5/003 |
| 2022/0201555 A1* | 6/2022 | Zeng | H04W 88/16 |
| 2022/0202295 A1* | 6/2022 | Elbaz | G16H 30/40 |
| 2022/0208355 A1* | 6/2022 | Li | G06T 7/0016 |
| 2022/0230066 A1* | 7/2022 | Das | G06N 3/048 |
| 2022/0234196 A1* | 7/2022 | Tachikake | G06N 3/047 |
| 2022/0238031 A1* | 7/2022 | Evans | B64C 39/024 |
| 2022/0253599 A1* | 8/2022 | Oh | G06F 16/353 |
| 2022/0254071 A1 | 8/2022 | Ojha et al. | |
| 2022/0254075 A1* | 8/2022 | Kanazawa | G06V 10/774 |
| 2022/0261657 A1* | 8/2022 | Puzanov | G06N 3/045 |
| 2022/0266453 A1* | 8/2022 | Lonsberry | B23K 37/0229 |
| 2022/0269906 A1* | 8/2022 | Takeda | G06N 3/045 |
| 2022/0292171 A1* | 9/2022 | Taher | G06V 20/53 |
| 2022/0292351 A1* | 9/2022 | Etemad | G06N 3/045 |
| 2022/0300809 A1* | 9/2022 | Okamoto | G06N 3/045 |
| 2022/0306311 A1* | 9/2022 | Kyono | G06V 20/58 |
| 2022/0309811 A1* | 9/2022 | Haghighi | G06V 10/764 |
| 2022/0318354 A1* | 10/2022 | Park | G06V 40/1382 |
| 2022/0318464 A1* | 10/2022 | Xu | G05D 1/0212 |
| 2022/0318956 A1* | 10/2022 | Xu | G06T 11/008 |
| 2022/0327657 A1* | 10/2022 | Zheng | G06T 11/60 |
| 2022/0335153 A1* | 10/2022 | Herman | G06N 3/094 |
| 2022/0335624 A1* | 10/2022 | Maurer | G06T 7/248 |
| 2022/0335672 A1* | 10/2022 | Lee | G06T 11/60 |
| 2022/0335679 A1* | 10/2022 | Afrasiabi | G06T 15/10 |
| 2022/0358255 A1* | 11/2022 | Burla | G06T 19/20 |

(56) References Cited

U.S. PATENT DOCUMENTS

| | | | | |
|---|---|---|---|---|
| 2022/0358265 | A1* | 11/2022 | Wang | G06F 30/27 |
| 2022/0361848 | A1* | 11/2022 | Wildeboer | G06T 11/006 |
| 2022/0366220 | A1* | 11/2022 | Roth | G06N 3/08 |
| 2022/0374720 | A1* | 11/2022 | Qu | G06F 18/214 |
| 2022/0375073 | A1* | 11/2022 | Voigt | G06T 5/009 |
| 2022/0377257 | A1* | 11/2022 | Wilson | G06N 20/00 |
| 2022/0383617 | A1* | 12/2022 | Blaiotta | G06V 10/764 |
| 2022/0392018 | A1* | 12/2022 | Chen | G16H 50/20 |
| 2022/0415019 | A1* | 12/2022 | Wang | G06V 10/764 |
| 2023/0010164 | A1* | 1/2023 | Cowan | G06N 3/08 |
| 2023/0023058 | A1* | 1/2023 | Niehaus | G06N 3/08 |
| 2023/0031755 | A1* | 2/2023 | Khoreva | G06V 10/7715 |
| 2023/0037591 | A1* | 2/2023 | Villegas | G06T 15/06 |
| 2023/0041233 | A1* | 2/2023 | Shen | G06V 10/774 |
| 2023/0044644 | A1* | 2/2023 | Elbaz | G06T 9/002 |
| 2023/0046926 | A1* | 2/2023 | Saxena | G06T 7/55 |
| 2023/0055980 | A1* | 2/2023 | Ding | G06N 3/088 |
| 2023/0060131 | A1* | 3/2023 | Wang | G06N 3/084 |
| 2023/0076868 | A1* | 3/2023 | Olender | G06T 5/005 |
| 2023/0080639 | A1* | 3/2023 | Zoss | G06T 17/00 382/100 |
| 2023/0082899 | A1* | 3/2023 | Corral-Soto | G06N 3/044 706/21 |
| 2023/0113154 | A1* | 4/2023 | Funka-Lea | A61B 8/12 600/443 |
| 2023/0127614 | A1* | 4/2023 | Weng | G06N 3/0475 706/20 |
| 2023/0133511 | A1* | 5/2023 | Sivaswamy | G06N 3/045 700/245 |
| 2023/0138367 | A1* | 5/2023 | Song | G06N 3/044 706/15 |
| 2023/0143072 | A1* | 5/2023 | Flöther | G06N 10/60 706/12 |
| 2023/0146192 | A1* | 5/2023 | Choi | G06N 3/044 382/131 |
| 2023/0146676 | A1* | 5/2023 | Liu | G06T 11/60 382/157 |
| 2023/0169626 | A1* | 6/2023 | Sidiya | G06V 10/7715 382/157 |
| 2023/0185998 | A1* | 6/2023 | Matei | G06F 30/27 703/2 |

OTHER PUBLICATIONS

Afrasiabi, A. et al., "System and Method for Automated Surface Anomaly Detection," U.S. Appl. No. 63/159,387, filed Mar. 10, 2021, 38 pages.

"Computing Device and Method for Generating Realistic Synthetic Image Data," U.S. Appl. No. 63/175,225, filed Apr. 15, 2020, 29 pages.

Luo, Y. et al., "Infrared Image Registration of Damage in the Aircraft Skin Based on Lie Group Machine Learning," Proceedings of the 2014 26th Chinese Control and Decision Conference (CCDC), May 31, 2014, Changsha, China, 5 pages.

Zhu, J. et al., "Unpaired Image-to-Image Translation using Cycle-Consistent Adversarial Networks," Proceedings of the 2017 IEEE International Conference on Computer Vision, Oct. 22, 2017, Venice, Italy, 18 pages.

"Synthetic Image Generation for Surface Anomaly Detection," U.S. Appl. No. 16/902,588, filed Jun. 16, 2021, 58 pages.

Afrasiabi, A., "Systems and Methods for Synthetic Image Generation," U.S. Appl. No. 17/444,122, filed Jul. 30, 2021, 62 pages.

European Patent Office, Extended European Search Report Issued in Application No. 22165086.4, dated Nov. 3, 2022, Germany, 6 pages.

Esfahani, S. et al., "A Survey of State-of-the-Art Gan-Based Approaches to Image Synthesis," Proceedings of the 9th International Conference on Computer Science, Engineering and Applications, Jul. 13, 2019, Toronto, Canada, 14 pages.

Niu, S. et al., "Defect Image Sample Generation With GAN for Improving Defect Recognition," IEEE Transactions on Automation Science and Engineering, vol. 17, No. 3, Jul. 2020, 12 pages.

Wang, Z. et al., "Generative Adversarial Networks in Computer Vision: A Survey and Taxonomy," ACM Computing Surveys, vol. 54, No. 2, Feb. 9, 2021, 38 pages.

Xue, J. et al., "Interactive Rendering and Modification of Massive Aircraft CAD Models in Immersive Environment," Computer-Aided Design and Applications, vol. 12, No. 4, Jul. 4, 2015, 11 pages.

Zhu, J. et al., "Visual Object Networks: Image Generation with Disentangled 3D Representation," Proceedings of the 32nd Conference on Neural Information Processing Systems, Dec. 3, 2018, Montreal, Canada, 12 pages.

United States Patent and Trademark Office, Office Action Issued in U.S. Appl. No. 16/902,588, dated Aug. 12, 2022, 22 pages.

United States Patent and Trademark Office, Final Office action issued in U.S. Appl. No. 16/902,588, dated Sep. 16, 2022, 27 pages.

European Patent Office, Extended European Search Report Issued in EP Application No. 22163745.7, dated Sep. 29, 2022, 7 pages.

* cited by examiner

FIG. 4 TRAINING PHASE FOR DISCRIMINATOR MODEL

SYSTEMS AND METHODS FOR SYNTHETIC IMAGE GENERATION

FIELD

The present invention relates to image recognition, and more particularly to an unsupervised cross-domain synthetic image generation system configured to train an object detection system.

BACKGROUND

Object detection systems implementing artificial intelligence are trained to accurately detect target objects using large realistic visual data sets, which have high accuracy, specificity, and diversity. High accuracy is achieved by reducing biases from human labelers. High specificity is achieved by capturing different images of the target object in various environmental conditions. High diversity is achieved by including various images of the target object from various view angles and perspectives. However, developing large realistic visual data sets with high accuracy, specificity, and diversity is a challenge, especially using conventional methods of manually taking pictures of the target objects using cameras, and having a human operator label each image with a ground truth target object class. These limitations have slowed the development and deployment of large scale object detection systems.

SUMMARY

An image generation system is provided for unsupervised cross-domain image generation relative to a first image domain and a second image domain. The image generation system comprises a processor, and a memory storing instructions. The processor executes the instructions to cause the system to: receive a 3D computer aided design (CAD) model comprising 3D model images of a target object; based on the 3D CAD model of the target object, generate a plurality of augmented CAD models of the target object comprising a plurality of data sets, each data set respectively corresponding to an associated one of a plurality of attribute classes, each data set comprising a plurality of 2D model images; input the plurality of data sets into a generative adversarial network comprising a plurality of generators respectively corresponding to the plurality of attribute classes and a plurality of discriminators respectively corresponding to the plurality of generators; generate synthetic photorealistic images of the target object using the plurality of generators, the synthetic photorealistic images including attributes in accordance with the plurality of data sets corresponding to the plurality of attribute classes; and output the synthetic photorealistic images of the target object.

The features, functions, and advantages that have been discussed can be achieved independently in various embodiments or can be combined in yet other embodiments further details of which can be seen with reference to the following description and drawings.

DETAILED DESCRIPTION

Figure 1:
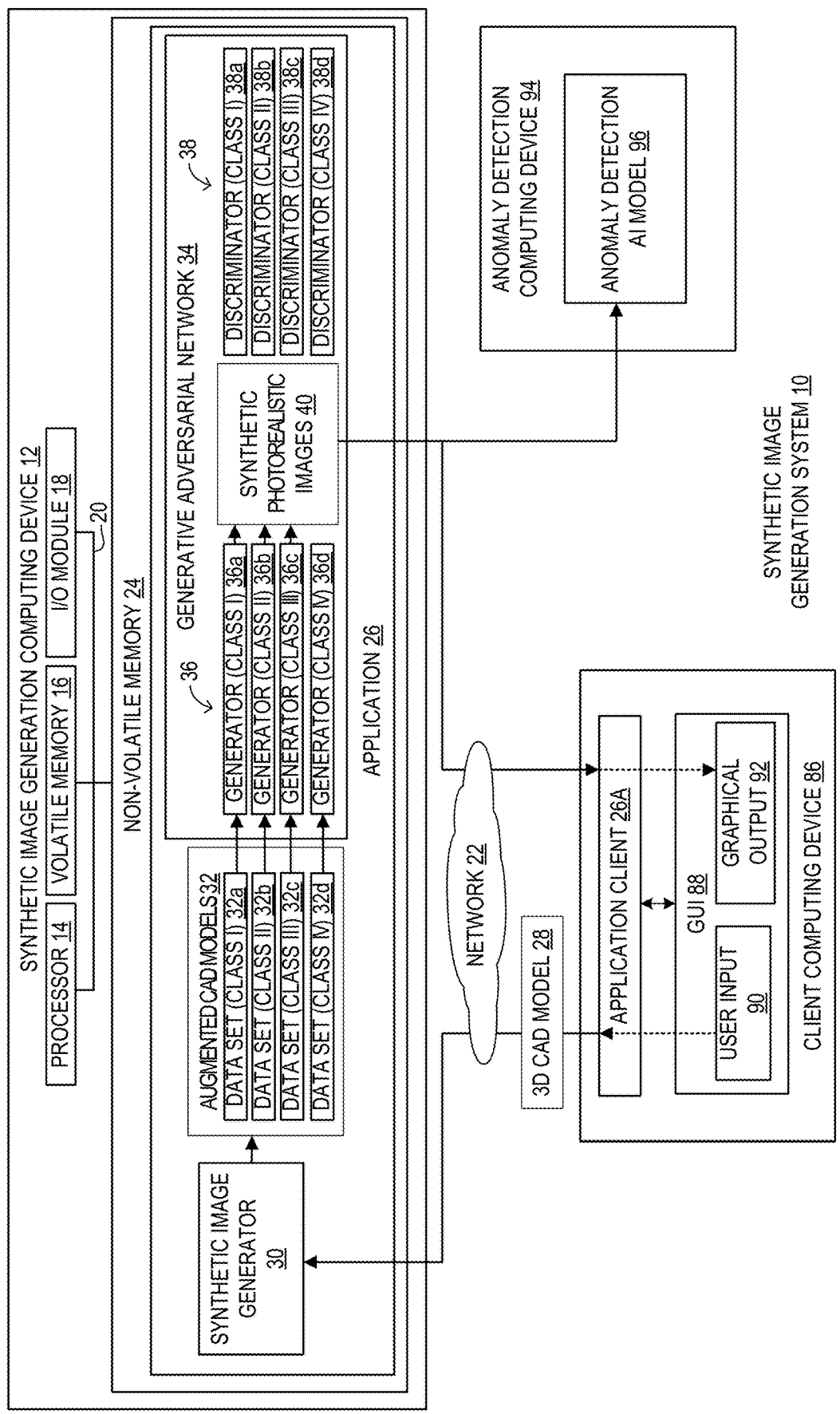
FIG. 1 is a general schematic diagram illustrating an overview of a synthetic image generation computing system for generating synthetic photorealistic images, according to an embodiment of the subject disclosure.

In view of the above issues, automated systems and methods are provided to generate large realistic visual data sets for training object detection systems. Referring to FIG. 1, a synthetic image generation system 10 is provided for use in generating synthetic photorealistic images. The synthetic image generation system 10 comprises a synthetic image generation computing device 12 including a processor 14, volatile memory 16, an input/output module 18, and non-volatile memory 24 storing an application 26 including a synthetic image generator 30, augmented CAD models 32, and a cycle generative adversarial network (GAN) 34. The synthetic image generation computing device 12 is configured to convert inputted 3D CAD models 28 into synthetic photorealistic images 40 using image-to-image translation or transfer, converting an image from one representation to another. In the present disclosure, the image-to-image translation or transfer is performed from 2D model images derived from a 3D CAD model into synthetic photorealistic images 40.

A communications bus 20 can operatively couple the processor 14, the input/output module 18, and the volatile memory 16 to the non-volatile memory 24. Although the synthetic image generator 30, augmented CAD models 32, and the generative adversarial network 34 are depicted as hosted (i.e., executed) at one computing device 12, it will be appreciated that the synthetic image generator 30, augmented CAD models 32, and the generative adversarial network 34 can alternatively be hosted across a plurality of computing devices to which the computing device 12 is communicatively coupled via a network 22.

As one example of one such other computing device, a client computing device 86 can be provided, which is operatively coupled to the synthetic image generation computing device 12. In some examples, the network 22 can take the form of a local area network (LAN), wide area network (WAN), wired network, wireless network, personal area network, or a combination thereof, and can include the Internet.

The computing device 12 comprises a processor 14 and a non-volatile memory 24 configured to store the synthetic image generator 30, augmented CAD models 32, and the generative adversarial network 34 in non-volatile memory 24. Non-volatile memory 24 is memory that retains instructions stored data even in the absence of externally applied power, such as FLASH memory, a hard disk, read only memory (ROM), electrically erasable programmable memory (EEPROM), etc. The instructions include one or more programs, including the synthetic image generator 30, augmented CAD models 32, the generative adversarial network 34, and data used by such programs sufficient to perform the operations described herein.

In response to execution by the processor 14, the instructions cause the processor 14 to execute the synthetic image generator 30 and the generative adversarial network 34 to receive a 3D CAD model 28 comprising 3D model images of a target object. Based on the 3D CAD model 28 of the target object, the synthetic image generator 30 generates a plurality of augmented CAD models 32 of the target object comprising a plurality of data sets 32a-d, each data set 32a-d respectively corresponding to an associated one of a plurality of attribute classes, each data set 32a-d comprising a plurality of 2D model images.

The plurality of data sets 32a-d are inputted into a generative adversarial network 34 comprising a plurality of generators 36a-d respectively corresponding to the plurality of attribute classes (Class I-IV) and a plurality of discriminators 38a-d respectively corresponding to the plurality of generators 36a-d. The plurality of attribute classes can include at least one of an anomaly class, a material textures class, an environmental conditions class, or a perspective views class, for example.

In one example, the client computing device 86 can execute an application client 26A to send at least a 3D CAD model 28 to the computing device 12 via a network 22. The generative adversarial network 34 generates synthetic photorealistic images 40 of the target objects using the plurality of generators 36a-d. The synthetic photorealistic images 40 include attributes in accordance with the plurality of data sets 32a-d corresponding to the plurality of attribute classes (Class I-IV). The application 26 outputs the synthetic photorealistic images 40 of the target object via the network 22 to the client computing device 86, which subsequently receives the synthetic photorealistic images 40 from the computing device 12 as output.

The synthetic photorealistic images 40 are then displayed as graphical output 92 on the graphical user interface 88 of the client computing device 86. The synthetic photorealistic images 40 can also be used to train an anomaly detection artificial intelligence model 96 of an anomaly detection computing device 94 to detect anomalies on target objects.

The processor 14 is a microprocessor that includes one or more of a central processing unit (CPU), a graphical processing unit (GPU), an application specific integrated circuit (ASIC), a system on chip (SOC), a field-programmable gate array (FPGA), a logic circuit, or other suitable type of microprocessor configured to perform the functions recited herein. The system 10 further includes volatile memory 16 such as random access memory (RAM), static random access memory (SRAM), dynamic random access memory (DRAM), etc., which temporarily stores data only for so long as power is applied during execution of programs. In some embodiments, non-volatile random access memory (NVRAM) may be used.

In this example, a graphical user interface (GUI) 88 of the client computing device 86 receives a user input 90. Responsive to the user input 90, the application client 26A of the client computing device 86 sends a 3D CAD model 28 to the synthetic image generator 30, which outputs augmented CAD models 32 with a plurality of data sets 32a-d based on the 3D CAD model 28. The plurality of augmented CAD models 32 can include a class I data set 32a, a class II data set 32b, a class III data set 32c, and a class IV data set 32d. It will be appreciated that the number of data sets and the number of attribute classes are not particularly limited. The data sets 32a-d of the augmented CAD models 32 are inputted into the generative adversarial network 34, which comprises a generator model 36 including a plurality of generators 36a-d and a discriminator model 38 including a plurality of discriminators 38a-d. The generative adversarial network 34 comprises neural networks. The generators 36a-d can be implemented by convolutional neural networks, and the discriminators 38a-d can be implemented by deconvolutional neural networks.

Each data set 32a-d is inputted into the respective generator corresponding to the attribute class of each data set. Therefore, in this example, the class I data set 32a is inputted into the class I generator 36a, the class II data set 32b is inputted into the class II generator 36b, the class III data set 32c is inputted into the class III generator 36c, and the class IV data set 32d is inputted into the class IV generator 36d. The generator models 36a-d are configured to generate synthetic photorealistic images 40 based on the data sets 32a-d. The discriminator models 38a-d are used to train the generator models 36a-d during a training process.

Figure 2:
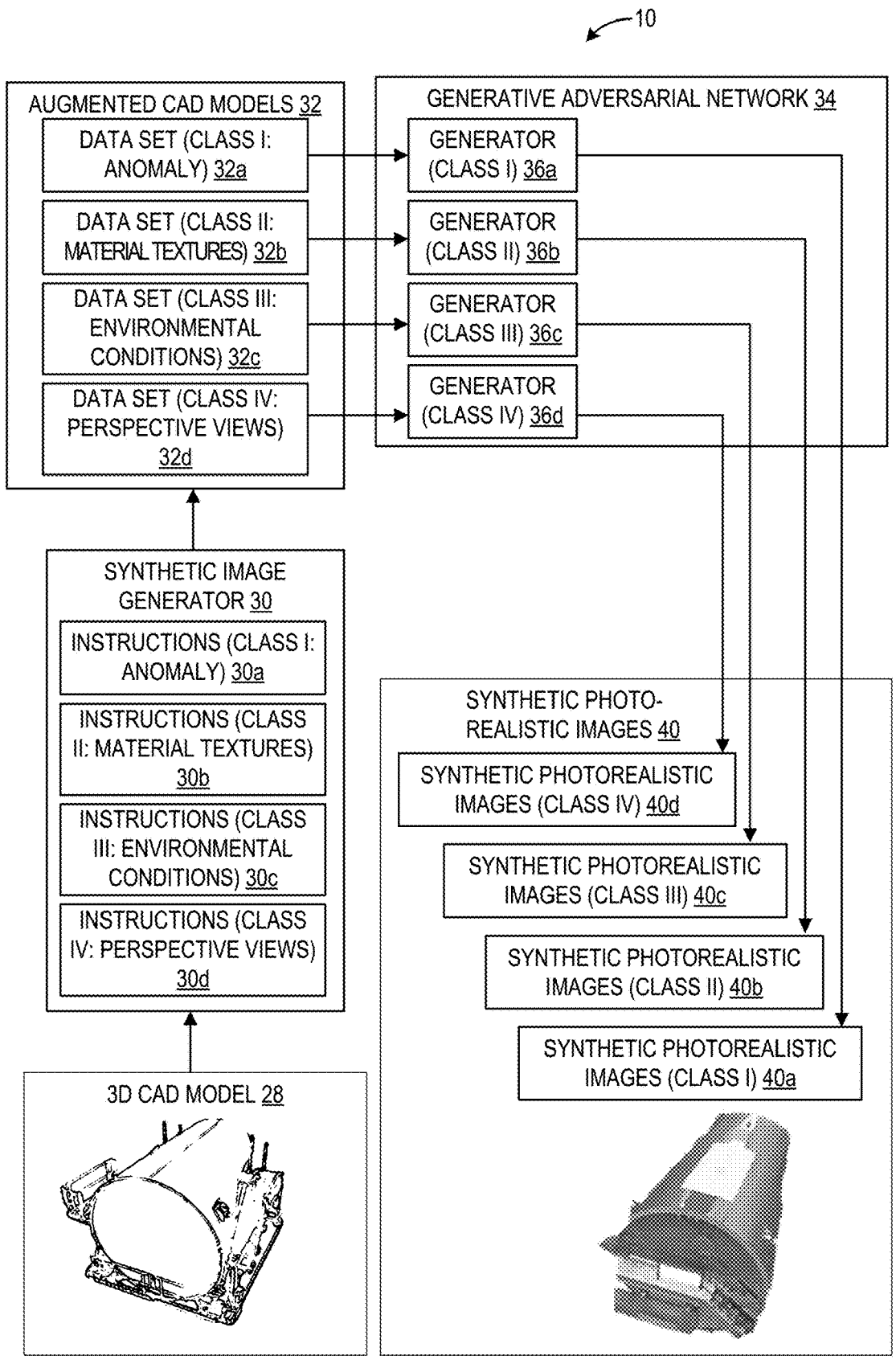
FIG. 2 is a detailed schematic diagram illustrating the inputs and outputs of the generative adversarial network of the system of FIG. 1.

Referring to FIG. 2, a schematic diagram depicts the inputs and outputs of the generators 36a-d of the generative adversarial network 34. In this example, the 3D CAD model 28 that is inputted into the synthetic image generator 30 is that of an aircraft component. The synthetic image generator 30 processes the 3D CAD model 28 to output augmented CAD models 32 comprising a class I data set 32a, a class II data set 32b, a class III data set 32c, and a class IV data set 32d. Each data set 32a-d comprises a plurality of 2D model images derived from the 3D CAD model 28. The plurality of 2D model images can comprise 2D pixelated images including pixel data.

The class I data set 32a is inputted into the class I generator 36a, which performs an image style transfer on the class I data set 32a to generate a plurality of class I synthetic photorealistic images 40a. Likewise, the class II data set 32b is inputted into the class II generator 36b, which performs an image style transfer on the class II data set 32b to generate a plurality of class II synthetic photorealistic images 40b. The class III data set 32c is inputted into the class III generator 36c, which performs an image style transfer on the class III data set 32c to generate a plurality of class III synthetic photorealistic images 40c. The class IV data set 32d is inputted into the class IV generator 36d, which performs an image style transfer on the class IV data set 32d to generate a plurality of class IV synthetic photorealistic images 40d.

In this example, the synthetic image generator 30 has generated 2D model images in the class I data set by adding various anomalies into the 3D CAD model 28 in accordance with class I anomaly instructions 30a and rendering the 2D model images from the 3D CAD model 28 with the added anomalies. For example, the class I anomaly instructions 30a can instruct the synthetic image generator to add a type A anomaly to the left wing of an airplane on 70% of the 2D model images and add a type B anomaly to the right wing of the airplane on 30% of the 2D model images. The class I anomaly instructions 30a can include other instructions prescribing the frequencies of the locations, sizes, and types of anomalies that appear on the 2D model images.

The synthetic image generator 30 has generated 2D model images in the class II data set 32b by adding various material textures into the 3D CAD model 28 in accordance with class II material textures instructions 30b and rendering the 2D model images from the 3D CAD model 28 with the added material textures. The synthetic image generator 30 has generated 2D model images in the class III data set 32c by adding various environmental conditions (various lighting and atmospheric conditions, for example) into the 3D CAD model 28 in accordance with class III environmental conditions instructions 30c and rendering the 2D model images from the 3D CAD model 28 with the added environmental conditions. The synthetic image generator 30 has generated 2D model images in the class IV data set 32d by taking 2D model images of the 3D CAD model 28 from various perspective views in accordance with class IV perspective views instructions 30d and rendering the 2D model images of the 3D CAD model 28 from the various perspective views.

The synthetic image generator 30 can selectively determine which data sets are outputted to the generative adversarial network 34 depending on the target application. For example, for dent detection applications in which synthetic photorealistic training images of dents on target objects with different material textures are to be generated, but the outputted training images are to be controlled for both environmental conditions and perspective views, the synthetic image generator 30 generates 2D model images in the class I data set 32a and the class II data set 32b, in which the images depict dents on different material textures of the target object, so that the generative adversarial network 34 can be trained to generate synthetic photorealistic images 40 of dents on different material textures of the target object. In this example, only the class I generator 36a and the class II generator 36b of the generators would be used to generate the synthetic photorealistic images 40. An inference script can be used by the synthetic image generator 30 to infer the target application and select the appropriate data sets to output to the generative adversarial network 34, to prepare a set of synthetic photorealistic images having the appropriate content to train an object detection system for the target application.

Figure 3:
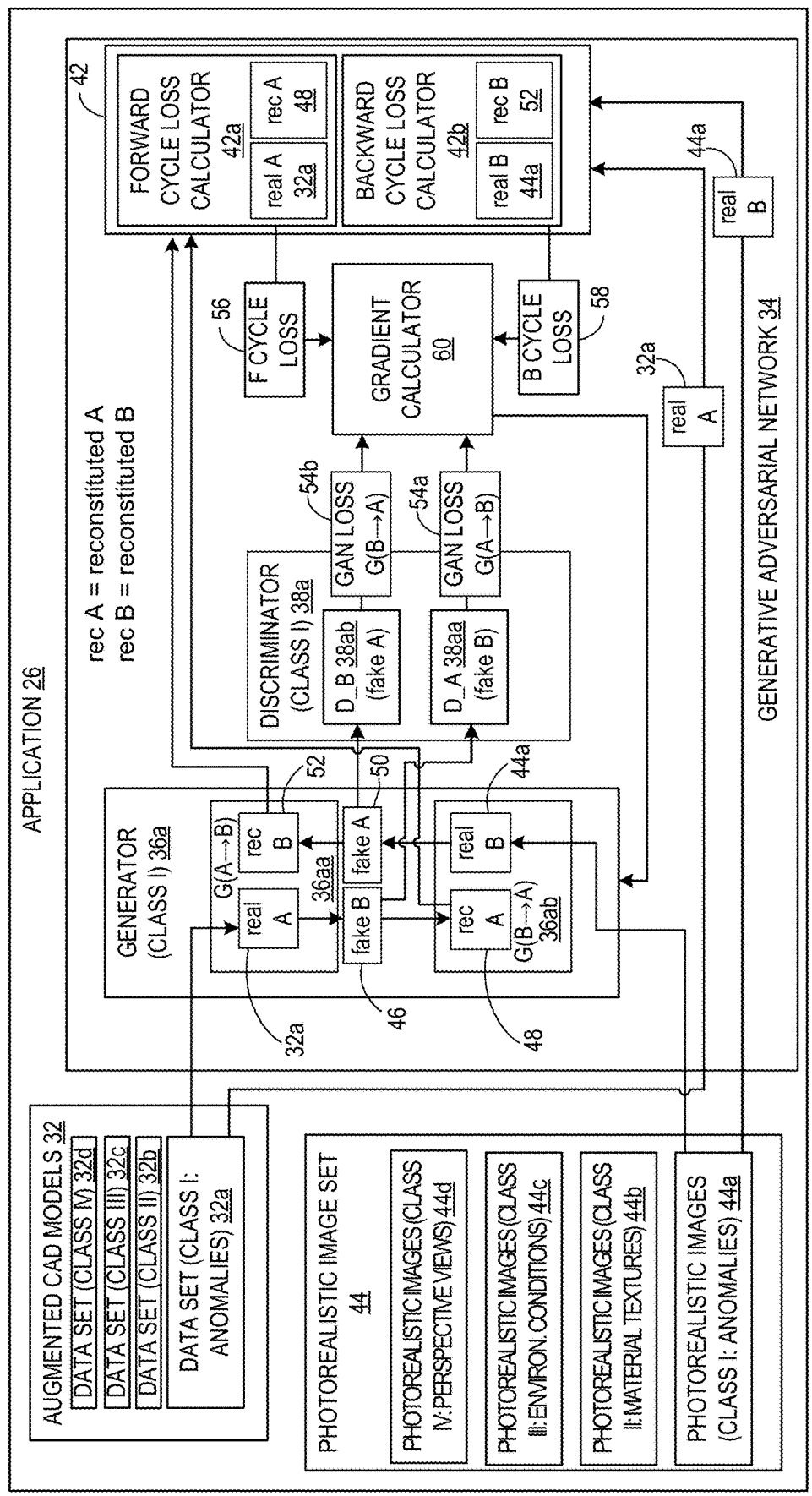
FIG. 3 is a schematic diagram illustrating the training of the generator model of the synthetic image generation computing system of FIG. 1.

Referring to FIG. 3, a schematic diagram is provided illustrating a training phase for training each generator model 36a-d in the generative adversarial network 34. The generator 36a receives input of the class I data set 32a of the augmented CAD models 32 and class I photorealistic images 44a as a first image domain input 32a and a second image domain input 44a, respectively. Although only the training of the class I generator 36a is depicted in this 2D model images, it will be appreciated that the training of the class II generator 36b, the training of the class III generator 36c, and the training of the class IV generator 36d are performed similarly to the training of the class I generator 36a. For the training of the class II generator 36b, the class II photorealistic images 44b and the class II data set 32b are inputted into the class II generator 36b. For the training of the class III generator 36c, the class III photorealistic images 44c and the class III data set 32c are inputted into the class III generator 36c. For the training of the class IV generator 36d, the class IV photorealistic images 44d and the class IV data set 32d are inputted into the class IV generator 36d.

In this example, the class I photorealistic images 44a are those of anomalies on the target object, including photographs of anomalies of different types, sizes, and locations on the target object. Class II photorealistic images 44b are those of various material textures on the target object, including photographs of various material textures on the target object. Class III photorealistic images 44c are those taken of the target object under various lighting and atmospheric conditions. Class IV photorealistic images 44d are those taken of the target object from various angles and perspective views. It will be appreciated that these are merely exemplary and many other types of classes can be utilized.

In this training process, the class I generator 36a is trained to capture special characteristics of the 2D model images of the class I data set 32a and translate them into synthetic photorealistic images. To do this, the first image domain input 32a (labeled "real A" in FIG. 3) and the second image domain input 44a (labeled "real B" in FIG. 3) are inputted into the class I generator model 36a. The first image domain input 32a is implemented as 2D model images in the class I data set 32a of the augmented CAD models 32, and the second image domain input 44a is implemented as class I photorealistic images 44a in the photorealistic image set 44. The first image generator 36aa (G(A→B)) of the class I generator model 36a converts the first image domain input 32a into fake photorealistic images 46 (labeled "fake B" in FIG. 3). In other words, the first image generator 36aa is configured to generate synthetic images (fake photorealistic images) 46 having a similar appearance to one or more of the photorealistic images 44a in the second image domain while including a semantic content of one or more 2D model images in the class I data set 32a depicting anomalies in the first image domain in accordance with an anomaly class data set 32a in the augmented CAD models 32 of the target object.

The second image generator 36ab of the class I generator model 36a converts the fake photorealistic images 46 into reconstituted 2D model images 48 (labeled "rec A" in FIG. 3). The second image generator 36ab also converts the second image domain input 44a into fake 2D model images 50 (labeled "fake A" in FIG. 3). In other words, the second image generator 36ab is configured to generate synthetic images (fake 2D model images) 50 having a similar appearance to one or more of the 2D model images of the class I data set 32a depicting anomalies in the first image domain while including semantic content of one or more photorealistic images 44a in the second image domain. The first image generator 36aa converts the fake 2D model images 50 into reconstituted photorealistic images 52 (labeled "rec B" in FIG. 3).

The fake photorealistic images 46 are inputted into the first image discriminator 38aa (D_A) of the class I discriminator 38a, which outputs a first GAN loss 54a for the first image generator 36aa estimating the probability that the fake photorealistic images 46 are real photorealistic images. The first image discriminator 38aa is configured to discriminate real photorealistic images 44a in the second image domain against synthetic (fake) photorealistic images 46 generated by the first image generator 36aa.

The fake 2D model images 50 are inputted into the second image discriminator 38ab (D_B) of the class I discriminator 38a, which outputs a second GAN loss 54b for the second image generator 36ab estimating the probability that the fake 2D model images 50 are real 2D model images. A second image discriminator 38ab configured to discriminate real 2D model images of the class I data set 32a depicting anomalies in the first image domain against synthetic (fake) 2D model images 50 depicting anomalies generated by the second image generator 36ab.

The class I photorealistic images 44a, the class I data set 32a, the reconstituted 2D model images 48, and the reconstituted photorealistic images 52 are also inputted into the cycle consistency loss calculator 42, which comprises a forward cycle consistency loss calculator 42a and a backward cycle consistency loss calculator 42b. The forward cycle consistency loss calculator 42a calculates a forward cycle consistency loss 56 between the 2D model images of the class I data set 32a and the reconstituted 2D model images 48. The backward cycle consistency loss calculator 42b calculates a backward cycle consistency loss 58 between the class I photorealistic images 44a and the reconstituted photorealistic images 52. The cycle consistency loss calculations performed by the cycle consistency loss calculator 42 can be those used in cycle GAN architectures used for performing unpaired image-to-image translation.

The gradient calculator 60 combines the first GAN loss 54a, the second GAN loss 54b, the forward cycle consistency loss 56, and the backward cycle consistency loss 58 to calculate gradients for the first image generator 36aa and the second image generator 36ab. Then, the gradient calculator 60 updates the weights for the first image generator 36aa and the second image generator 36ab in accordance with the calculated gradients.

Figure 4:
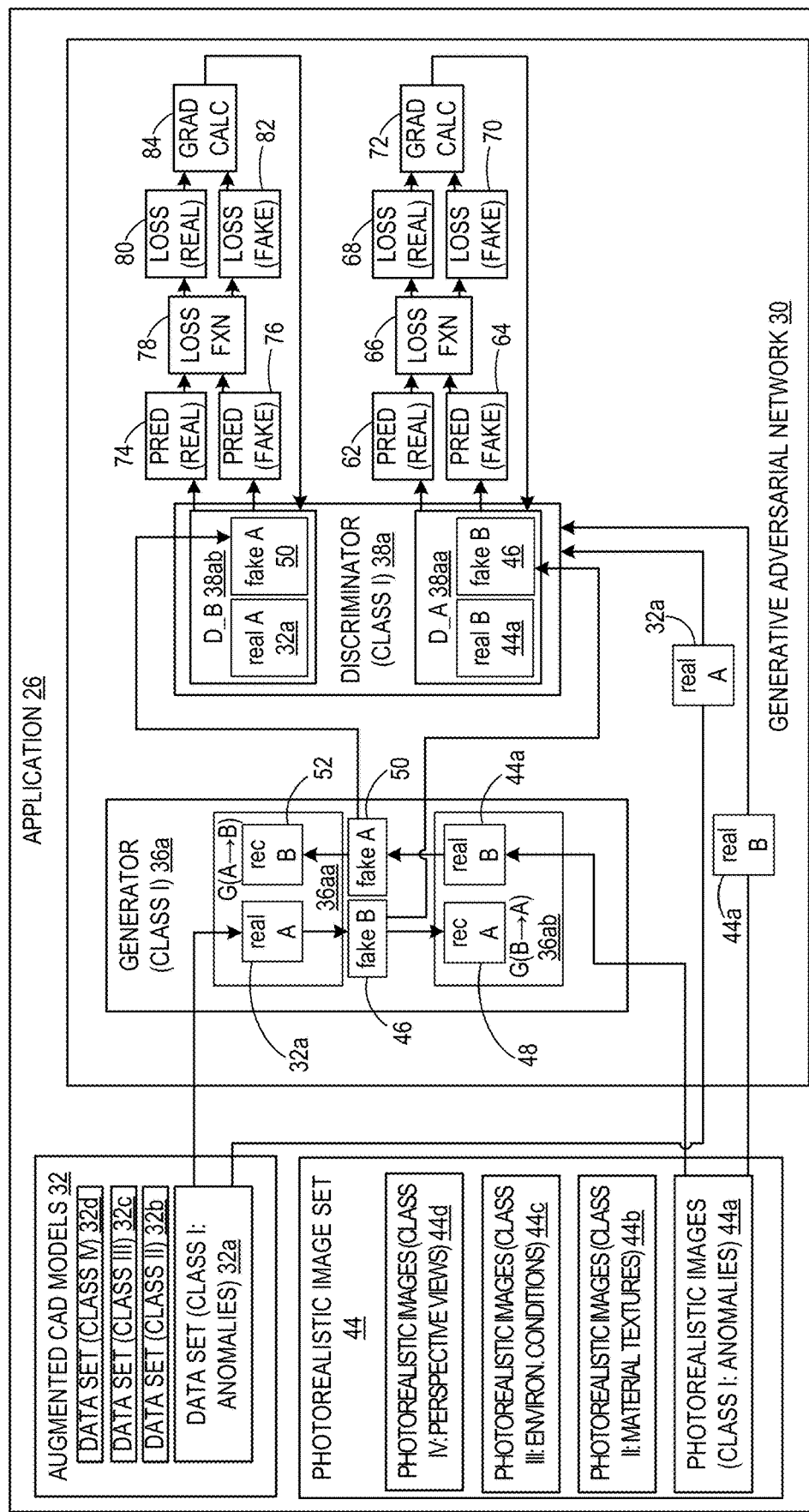
FIG. 4 is a schematic diagram illustrating the training of the discriminator model of the synthetic image generation computing system of FIG. 1.

Referring to FIG. 4, a schematic diagram is provided illustrating a training phase for training each discriminator model 38a-d in the generative adversarial network 34 respectively corresponding to the generator models 36a-d. The class I discriminator receives input of the fake photorealistic images 46 and the fake 2D model images 50 outputted by the generator 36a, the 2D model images of the class I data set 32a, and the class I photorealistic images 44a.

Although only the training of the class I discriminator 38a is depicted in this 2D model images, it will be appreciated that the training of the class II discriminator 38b, training of the class III discriminator 38c, and the training of the class IV discriminator 38d are performed similarly to the training of the class I discriminator 38a.

For the training of the class II discriminator 38b, the class II photorealistic images 44b and the class II data set 32b are inputted into the class II discriminator 38b along with fake photorealistic images 46 and the fake 2D model images 50 outputted by the class II generator 36b. For the training of the class III discriminator 38c, the class III photorealistic images 44c and the class III data set 32c are inputted into the class III discriminator 38c, along with fake photorealistic images 46 and the fake 2D model images 50 outputted by the class III generator 36c. For the training of the class IV discriminator 38d, the class IV photorealistic images 44d and the class IV data set 32d are inputted into the class IV discriminator 38d along with fake photorealistic images 46 and the fake 2D model images 50 outputted by the class IV generator 36d.

In this training process for the first image discriminator 38aa (D_A) of the class I discriminator 38a, the first image discriminator 38aa distinguishes between the class I photorealistic images 44a and fake photorealistic images 46 to calculate a real prediction probability 62 that the class I photorealistic images 44a are real photorealistic images, and further calculate a fake prediction probability 64 that the fake photorealistic images 46 are fake photorealistic images. The loss function 66 calculates a real discriminator loss 68 based on the real prediction probability 62, and further calculates a fake discriminator loss 70 based on the fake prediction probability 64. The gradient calculator 72 combines the real discriminator loss 68 and the fake discriminator loss 70 to calculate a gradient for the first image discriminator 38aa. Then the gradient calculator 72 updates the weights of the first image discriminator 38aa in accordance with the calculated gradient.

In this training process for the second image discriminator 38ab (D_B) of the class I discriminator 38a, the second image discriminator 38ab distinguishes between the fake 2D model images 50 outputted by the generator 36a and the 2D model images of the class I data set 32a, to calculate a real prediction probability 74 that the 2D model images of the class I data set 32a are real 2D model images, and further calculate a fake prediction probability 76 that the fake 2D model images 50 are fake 2D model images. The loss function 78 calculates a real discriminator loss 80 based on the real prediction probability 74, and further calculates a fake discriminator loss 82 based on the fake prediction probability 76. The gradient calculator 84 combines the real discriminator loss 80 and the fake discriminator loss 82 to calculate a gradient for the second image discriminator 38ab. Then the gradient calculator 84 updates the weights of the second image discriminator 38ab in accordance with the calculated gradient.

For the first GAN loss 54a and the second GAN loss 54b described in FIG. 3 and the discriminator losses 68, 70, 80, and 82 described in FIG. 4, it will be appreciated that methods for calculating the losses are not particularly limited. For example, a mean squared error loss function or a binary cross entropy loss function can be used to calculate the losses.

Figure 5:
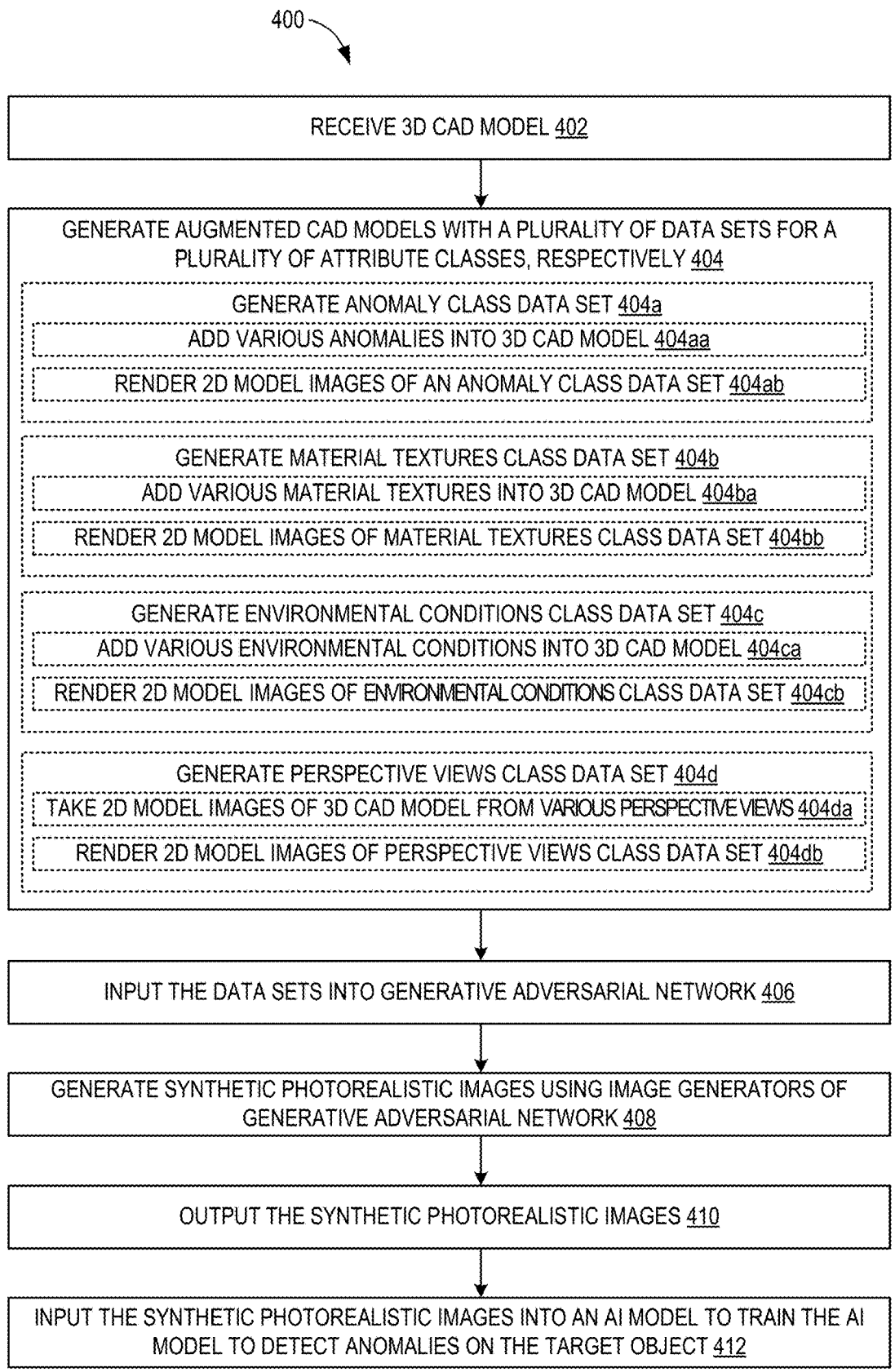
FIG. 5 is a flowchart of a method for using the generator model of the generative adversarial network to generate synthetic photorealistic images according to an embodiment of the subject disclosure.

Referring to FIG. 5, a method 400 for translating a 3D CAD model of a target object into synthetic photorealistic images of the target object is described. The following description of method 400 is provided with reference to the software and hardware components described above and shown in FIGS. 1 and 2. It will be appreciated that method 400 also can be performed in other contexts using other suitable hardware and software components.

At step 402, a 3D CAD model 28 is received comprising 3D model images of a target object. At step 404, augmented CAD models 32 are generated, based on the 3D CAD model 28 of the target object, comprising a plurality of data sets 32a-d, each data set 32a-d respectively corresponding to an associated one of a plurality of attribute classes, each data set 32a-d comprising a plurality of 2D model images. Step 404 can include steps 404a-d: step 404a of generating an anomaly class data set 32a, step 404b of generating a material textures class data set 32b, step 404c of generating an environmental conditions class data set 32c, and step 404d of generating a perspective views class data set 32d. Accordingly, by generating 2D model images instead of 3D model images, processing power demands can be reduced.

Step 404a of generating an anomaly class data set 32a can include step 404aa of adding various anomalies into the 3D CAD model 28 augmented in accordance with anomaly instructions 30a, and step 404ab of rendering 2D model images of an anomaly class data set 32a of the anomaly class using the augmented CAD model 32. Accordingly, the anomaly class data set 32a can be generated with great diversity in the depictions of various anomalies in accordance with the anomaly instructions 30a. Furthermore, the diversity of various anomalies depicted in the anomaly class data set 32a can accurately reflect the diversity of various anomalies that is actually encountered on the target object in the real manufacturing environment.

Step 404b of generating a material textures class data set 32b can include step 404ba of adding various material textures into the 3D CAD model 28 augmented in accordance with material textures instructions 30b, and step 404bb of rendering 2D model images of the material textures class data set 32b of the material textures class using the augmented CAD model 32. Accordingly, the material textures class data set 32*b* can be generated with great diversity in the depictions of various material textures in accordance with the material textures instructions 30*b*. Furthermore, the diversity of various material textures depicted in the material textures class data set 32*b* can accurately reflect the diversity of various material textures that is actually encountered on the target object in the real manufacturing environment.

Step 404*c* of generating an environmental conditions class data set 32*c* can include step 404*ca* of adding various environmental conditions into the 3D CAD model 28 augmented in accordance with environmental conditions instructions 30*c*, and step 404*cb* of rendering 2D model images of the environmental conditions class data set 32*c* of the environmental conditions class using the augmented CAD model 32. Accordingly, the environmental conditions class data set 32*c* can be generated with great diversity in the depictions of various environmental conditions in accordance with the environmental conditions instructions 30*c*. Furthermore, the diversity of various environmental conditions depicted in the environmental conditions class data set 32*c* can accurately reflect the diversity of various environmental conditions that is actually encountered for the target object in the real manufacturing environment.

Step 404*d* of generating a perspective views class data set 32*d* can include step 404*da* of taking 2D model images of the 3D CAD model 28 from various perspective views augmented in accordance with perspective views instructions 30*d*, and step 404*db* of rendering 2D model images of the perspective views class data set 32*d* of the perspective views class using the augmented CAD model 32. Accordingly, the perspective views class data set 32*d* can be generated with great diversity in the depictions of various perspective views in accordance with the perspective views instructions 30*d*.

At step 406, the data sets 32*a-d* are inputted into a generative adversarial network 34 comprising a plurality of image generators 36*a-d* respectively corresponding to the plurality of attribute classes and a plurality of image discriminators 38*a-d* respectively corresponding to the plurality of image generators 36*a-d*. At step 408, the synthetic photorealistic images 40 of the target object are generated by the plurality of image generators 36*a-d*. The generated synthetic photorealistic images 40 include attributes in accordance with the plurality of data sets 32*a-d* corresponding to the plurality of attribute classes. At step 410, the synthetic photorealistic images 40 of the target object are outputted on a graphical user interface 88 of a client computing device 86. At step 412, the synthetic photorealistic images 40 of the target object are inputted into an anomaly detection artificial intelligence model 96 to train the anomaly detection artificial intelligence model 96 to detect anomalies on the target object.

Figure 6:
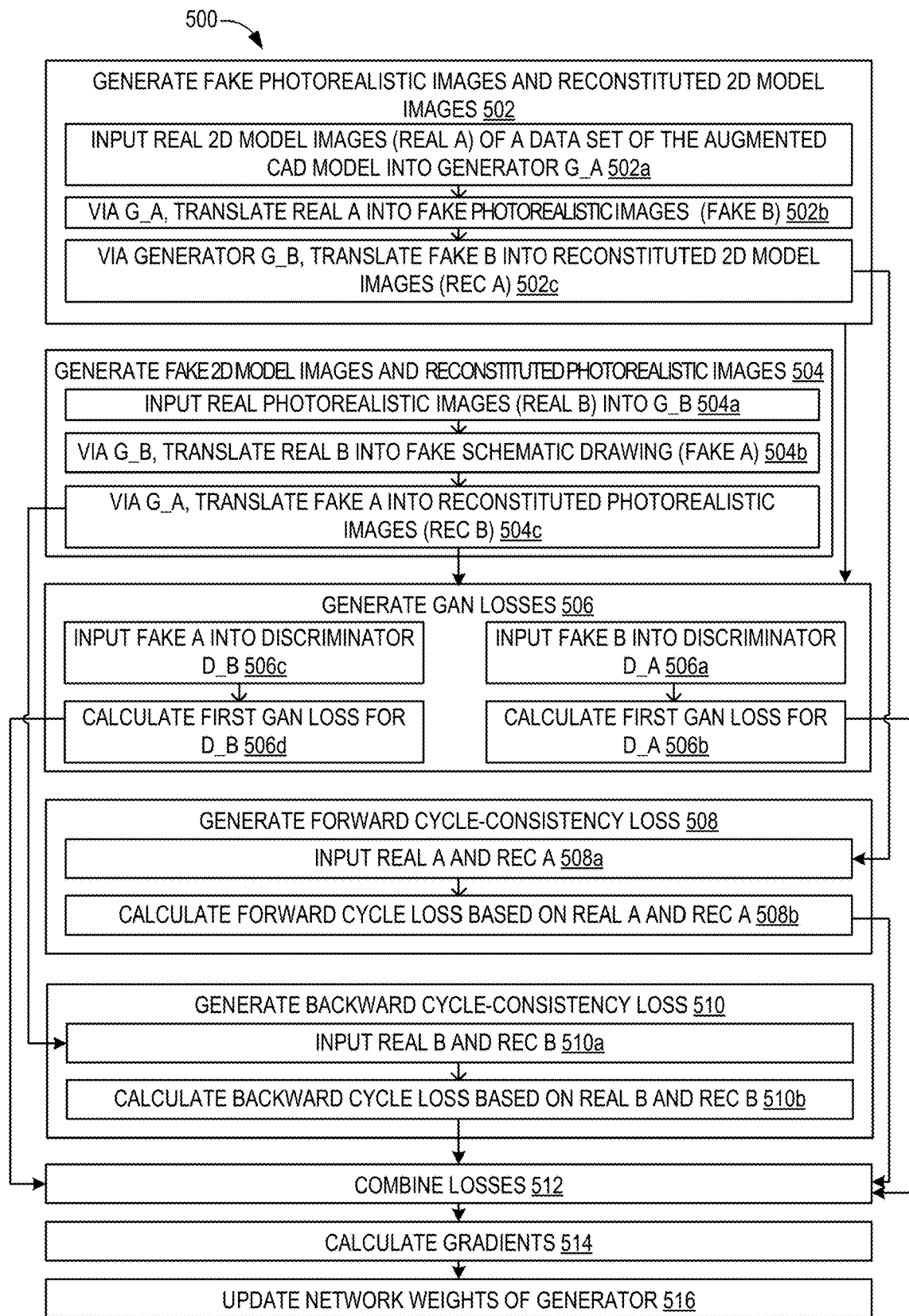
FIG. 6 is a flowchart of a method for training the generator model of the generative adversarial network according to an embodiment of the subject disclosure.

Referring to FIG. 6, a method 500 for training the generator model 36 of the generative adversarial model 34 is described. The following description of method 500 is provided with reference to the software and hardware components described above and shown in FIGS. 1-3. It will be appreciated that method 500 also can be performed in other contexts using other suitable hardware and software components.

At step 502, fake photorealistic images 46 and reconstituted 2D model images 48 are generated. Step 502 includes step 502*a* of inputting real 2D model images 32*a* (real A) of a data set of the augmented CAD models 32 into the first image generator 36*aa* (G_A), step 502*b* of, via the first image generator 36*aa* (G_A), translating the real 2D model images 32*a* (real A) into fake photorealistic images 46 (fake B), and step 502*c* of, via the second image generator 36*ab* (G_B), translating the fake photorealistic images 46 (fake B) into reconstituted 2D model images 48 (rec A).

At step 504, fake 2D model images 50 and reconstituted photorealistic images 52 are generated. Step 504 includes step 504*a* of inputting real photorealistic images 44*a* (real B) into the second image generator 36*ab* (G_B), step 504*b* of, via the second image generator 36*ab* (G_B), translating the real photorealistic images 44*a* (real B) into fake 2D model images 50 (fake A), and step 504*c* of, via the first image generator 36*aa* (G_A), translating the fake 2D model images 50 (fake A) into reconstituted photorealistic images 52 (rec B). It will be appreciated that, since the generative adversarial model 34 does not require paired data sets for training, the real 2D model images 32*a* (real A) and the real photorealistic images 44*a* (real B) can be used during training as unpaired data sets, thereby relaxing the requirements for training the synthetic image generation computing device 12.

At step 506, GAN losses are generated by inputting the fake images 50, 46 (fake A, fake B) into the second image discriminator 38*ab* (D_B) and first image discriminator 38*aa* (D_A), respectively. Step 506 includes step 506*a* of inputting the fake photorealistic images 46 (fake B) into the first image discriminator 38*aa* (D_A), and step 506*b* of calculating the first GAN loss 54*a* for the first image discriminator 38*aa* (D_A) by estimating the probability that the fake photorealistic images 46 (fake B) are real photorealistic images. Step 506 also includes step 506*c* of inputting the fake 2D model images 50 (fake A) into the second image discriminator 38*ab* (D_B), and step 506*d* of calculating the second GAN loss 54*b* for the second image discriminator 38*ab* (D_B) by estimating the probability that the fake 2D model images 50 (fake A) are real 2D model images.

At step 508, the forward cycle-consistency loss 56 is generated. Step 508 includes step 508*a* of inputting the real 2D model images 32*a* (real A) and the reconstituted 2D model images 48 (rec A) into a forward cycle loss calculator 42*a*, and step 508*b* of calculate a forward cycle-consistency loss 56 between the real 2D model images 32*a* (real A) and the reconstituted 2D model images 48 (rec A).

At step 510, the backward cycle-consistency loss 58 is generated. Step 510 includes step 510*a* of inputting the real photorealistic images 44*a* (real B) and the reconstituted photorealistic images 52 (rec B) into the backward cycle loss calculator 42*b*, and step 510*b* of calculating the backward cycle-consistency loss 58 between the real photorealistic images 44*a* (real B) and the reconstituted photorealistic images 52 (rec B).

At step 512, the GAN losses 54*a*, 54*b*, the forward cycle-consistency loss 56, and the backward cycle-consistency loss 58 are combined. At step 514, the gradients for the first image generator 36*aa* (G_A) and the second image generator 36*ab* (G_B) are calculated based on the combined losses. At step 516, the network weights of the first image generator 36*aa* (G_A) and the second image generator 36*ab* (G_B) are updated based on the calculated gradients.

Figure 7:
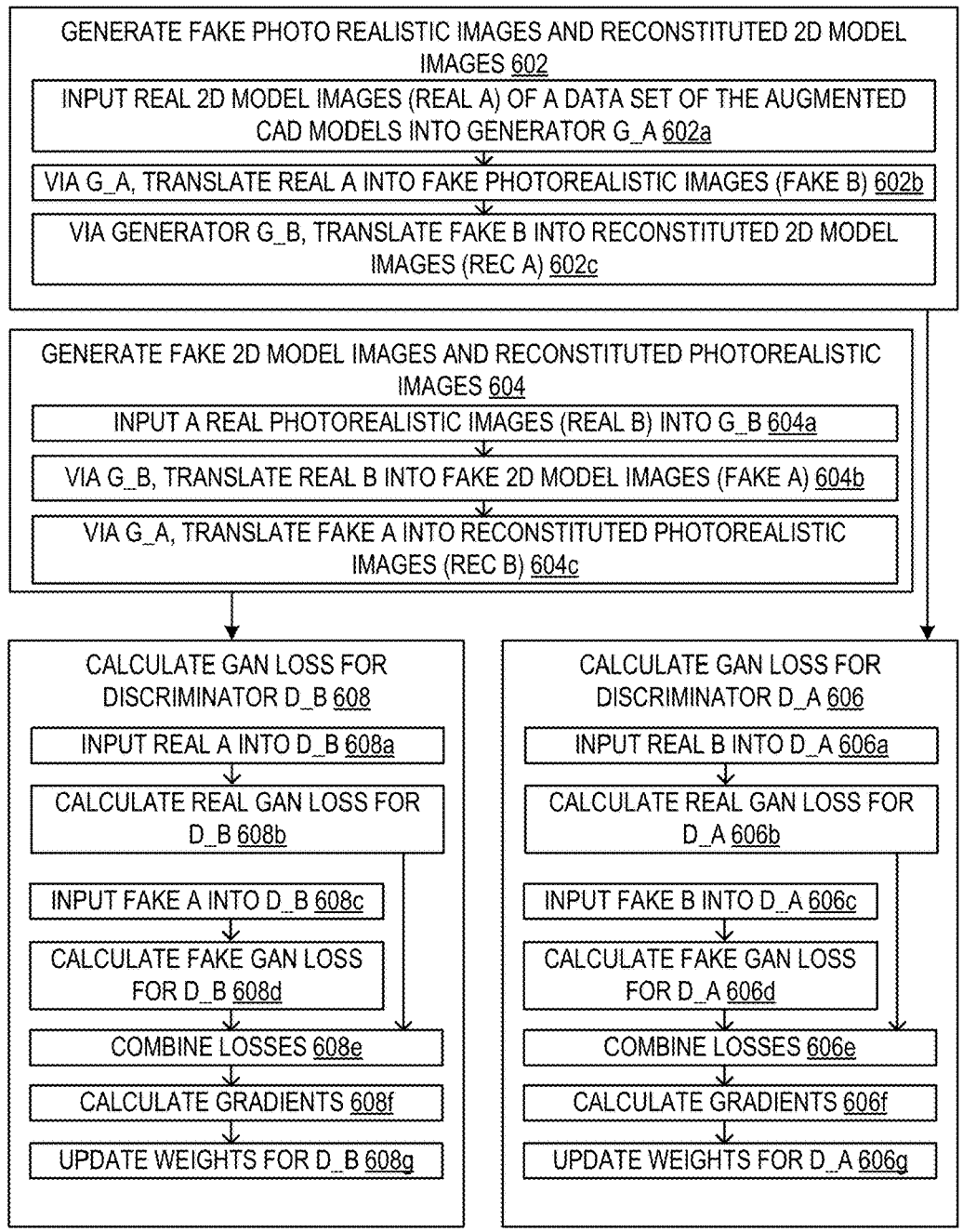
FIG. 7 is a flowchart of a method for training the discriminator model of the generative adversarial network according to an embodiment of the subject disclosure.

Referring to FIG. 7, a method 600 for training the discriminator model 38 of the generative adversarial model 34 is described. The following description of method 600 is provided with reference to the software and hardware components described above and shown in FIGS. 1, 2, and 4. It will be appreciated that method 600 also can be performed in other contexts using other suitable hardware and software components.

At step 602, fake photorealistic images 46 and reconstituted 2D model images 48 are generated. Step 602 includes step 602*a* of inputting real 2D model images (real A) of a data set of the augmented CAD models 32 into the first image generator 36*aa* (G_A), step 602*b* of, via the first image generator 36*aa* (G_A), translating the real 2D model images 32*a* (real A) into fake photorealistic images 46 (fake B), and step 602*c* of, via the second image generator 36*ab* (G_B), translating the fake photorealistic images 46 (fake B) into reconstituted 2D model images 48 (rec A).

At step 604, fake 2D model images 50 and reconstituted photorealistic images 52 are generated. Step 604 includes step 604*a* of inputting real photorealistic images 44*a* (real B) into the second image generator 36*ab* (G_B), step 604*b* of, via the second image generator 36*ab* (G_B), translating the real photorealistic images 44*a* (real B) into fake 2D model images 50 (fake A), and step 604*c* of, via the first image generator 36*aa* (G_A), translating the fake 2D model images 50 (fake A) into reconstituted photorealistic images 52 (rec B).

At step 606, the real discriminator loss 68 (real GAN loss) and fake discriminator loss 70 (fake GAN loss) for the first image discriminator 38*aa* (D_A) are calculated. Step 606 includes step 606*a* of inputting real photorealistic images 44*a* (real B) into the first image discriminator 38*aa* (D_A), and step 606*b* of calculating the real GAN loss 68 for the first image discriminator 38*aa* (D_A) by distinguishing between the real photorealistic images 44*a* and the fake photorealistic images 46 to calculate a real prediction probability 62 that the real photorealistic images 44*a* are real, and further calculating the real GAN loss 68 from the real prediction probability 62. Step 606 further includes step 606*c* of inputting the fake photorealistic images 46 (fake B) into the first image discriminator 38*aa* (D_A), and step 606*d* of calculating the fake GAN loss 70 for the first image discriminator 38*aa* (D_A) by distinguishing between the real photorealistic images 44*a* and the fake photorealistic images 46 to calculate a fake prediction probability 64 that the fake photorealistic images 46 are fake, and further calculating the fake GAN loss 70 from the fake prediction probability 64. Step 606 further includes step 606*e* of combining the real GAN loss 68 and the fake GAN loss 70 for the first image discriminator 38*aa* (D_A), step 606*f* of calculating the gradients based on the combined GAN losses, and step 606*g* of updating the network weights for the first image discriminator 38*aa* (D_A) based on the calculated gradients.

At step 608, the real discriminator loss 80 (real GAN loss) and fake discriminator loss 82 (fake GAN loss) for the second image discriminator 38*ab* (D_B) are calculated. Step 608 includes step 608*a* of inputting real 2D model images 32*a* (real A) into the second image discriminator 38*ab* (D_B), and step 608*b* of calculating the real GAN loss 80 for the second image discriminator 38*ab* (D_B) by distinguishing between the fake 2D model images 50 outputted by the generator 36*a* and real 2D model images of a data set 32*a* of the augmented CAD models 32, calculating a real prediction probability 74 that the real 2D model images 32*a* are real, and further calculating the real GAN loss 80 from the real prediction probability 74. Step 608 further includes step 608*c* of inputting the fake 2D model images 50 (fake A) into the second image discriminator 38*ab* (D_B), and step 608*d* of calculating the fake GAN loss 82 for the second image discriminator 38*ab* (D_B) by distinguishing between the fake 2D model images 50 outputted by the generator 36*a* and real 2D model images of a data set 32*a* of the augmented CAD models 32, calculating a fake prediction probability 76 that the fake 2D model images 50 are fake, and further calculating the fake GAN loss 82 from the fake prediction probability 76. Step 608 further includes step 608*e* of combining the real GAN loss 80 and the fake GAN loss 82 for the second image discriminator 38*ab* (D_B), step 608*f* of calculating the gradients based on the combined GAN losses, and step 608*g* of updating the network weights for the second image discriminator 38*ab* (D_B) based on the calculated gradients.

The systems and processes described herein have the potential benefit of generating large photorealistic visual data sets with high accuracy, specificity, and diversity for the training of large scale object detection systems employing artificial intelligence models.

Figure 8:
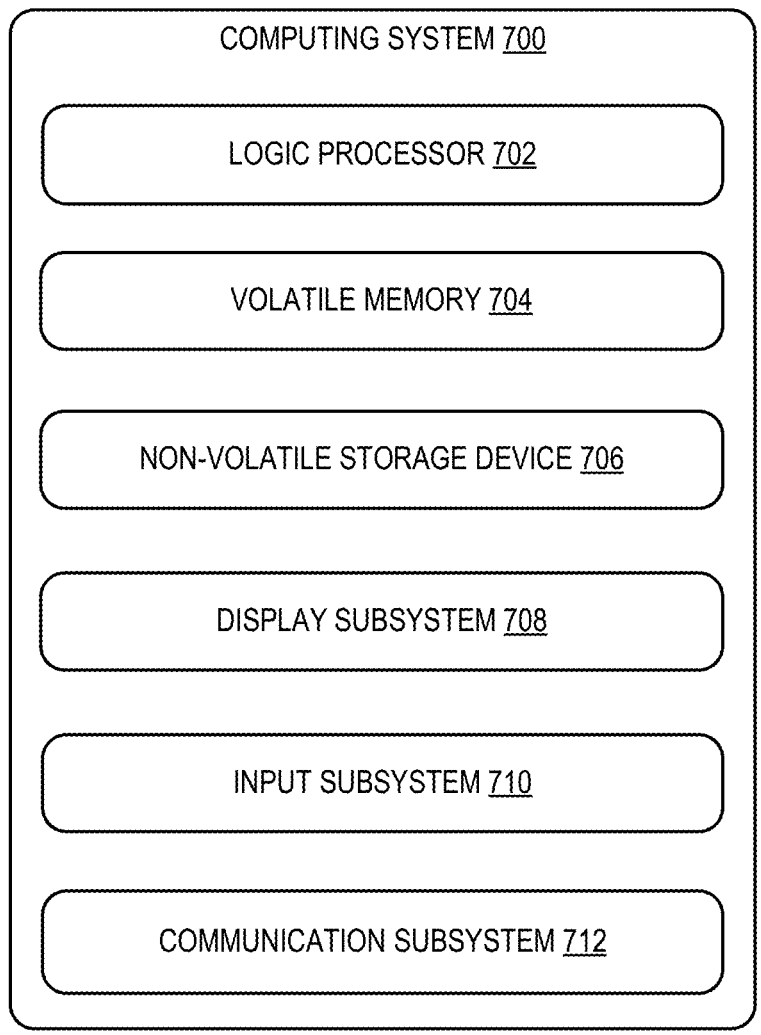
FIG. 8 is a schematic diagram illustrating an exemplary computing system that can be used to implement the synthetic image generation computing system of FIG. 1.

FIG. 8 illustrates an exemplary computing system 700 that can be utilized to implement the synthetic image generation system 10 and the methods 400, 500, and 600 described above. Computing system 700 includes a logic processor 702, volatile memory 704, and a non-volatile storage device 706. Computing system 700 can optionally include a display subsystem 708, input subsystem 710, communication subsystem 712 connected to a computer network, and/or other components not shown in FIG. 8. These components are typically connected for data exchange by one or more data buses when integrated into single device, or by a combination of data buses, network data interfaces, and computer networks when integrated into separate devices connected by computer networks.

The non-volatile storage device 706 stores various instructions, also referred to as software, that are executed by the logic processor 702. Logic processor 702 includes one or more physical devices configured to execute the instructions. For example, the logic processor 702 can be configured to execute instructions that are part of one or more applications, programs, routines, libraries, objects, components, data structures, or other logical constructs. Such instructions can be implemented to perform a task, implement a data type, transform the state of one or more components, achieve a technical effect, or otherwise arrive at a desired result.

The logic processor 702 can include one or more physical processors (hardware) configured to execute software instructions. Additionally or alternatively, the logic processor 702 can include one or more hardware logic circuits or firmware devices configured to execute hardware-implemented logic or firmware instructions. Processors of the logic processor 702 can be single-core or multi-core, and the instructions executed thereon can be configured for sequential, parallel, and/or distributed processing. Individual components of the logic processor 702 optionally can be distributed among two or more separate devices, which can be remotely located and/or configured for coordinated processing. Aspects of the logic processor 702 can be virtualized and executed by remotely accessible, networked computing devices configured in a cloud-computing configuration. In such a case, these virtualized aspects are run on different physical logic processors of various different machines, it will be understood.

Non-volatile storage device 706 includes one or more physical devices configured to hold instructions executable by the logic processors to implement the methods and processes described herein. When such methods and processes are implemented, the state of non-volatile storage device 706 can be transformed—e.g., to hold different data.

Non-volatile storage device 706 can include physical devices that are removable and/or built-in. Non-volatile storage device 706 can include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 706 can include nonvolatile, dynamic, static, read/write, read-only, sequential-access, location-addressable, file-addressable, and/or content-addressable devices. It will be appreciated that non-volatile storage device 706 is configured to hold instructions even when power is cut to the non-volatile storage device 706.

Volatile memory 704 can include physical devices that include random access memory. Volatile memory 704 is typically utilized by logic processor 702 to temporarily store information during processing of software instructions. It will be appreciated that volatile memory 704 typically does not continue to store instructions when power is cut to the volatile memory 704.

Aspects of logic processor 702, volatile memory 704, and non-volatile storage device 706 can be integrated together into one or more hardware-logic components. Such hardware-logic components can include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" can be used to describe an aspect of the synthetic image generation computing system 10 typically implemented in software by a processor to perform a particular function using portions of volatile memory, which function involves transformative processing that specially configures the processor to perform the function. Thus, a module, program, or engine can be instantiated via logic processor 702 executing instructions held by non-volatile storage device 706, using portions of volatile memory 704. It will be understood that different modules, programs, and/or engines can be instantiated from the same application, service, code block, object, library, routine, API, function, etc. Likewise, the same module, program, and/or engine can be instantiated by different applications, services, code blocks, objects, routines, APIs, functions, etc. The terms "module," "program," and "engine" can encompass individual or groups of executable files, data files, libraries, drivers, scripts, database records, etc.

Display subsystem 708 typically includes one or more displays, which can be physically integrated with or remote from a device that houses the logic processor 702. Graphical output of the logic processor executing the instructions described above, such as a graphical user interface, is configured to be displayed on display subsystem 708.

Input subsystem 710 typically includes one or more of a keyboard, pointing device (e.g., mouse, trackpad, finger operated pointer), touchscreen, microphone, and camera. Other input devices can also be provided.

Communication subsystem 712 is configured to communicatively couple various computing devices described herein with each other, and with other devices. Communication subsystem 712 can include wired and/or wireless communication devices compatible with one or more different communication protocols. As non-limiting examples, the communication subsystem can be configured for communication via a wireless telephone network, or a wired or wireless local- or wide-area network by devices such as a 3G, 4G, 5G, or 6G radio, WIFI card, ethernet network interface card, BLUETOOTH radio, etc. In some embodiments, the communication subsystem can allow computing system 700 to send and/or receive messages to and/or from other devices via a network such as the Internet. It will be appreciated that one or more of the computer networks via which communication subsystem 712 is configured to communicate can include security measures such as user identification and authentication, access control, malware detection, enforced encryption, content filtering, etc., and can be coupled to a wide area network (WAN) such as the Internet.

The subject disclosure includes all novel and non-obvious combinations and subcombinations of the various features and techniques disclosed herein. The various features and techniques disclosed herein are not necessarily required of all examples of the subject disclosure. Furthermore, the various features and techniques disclosed herein can define patentable subject matter apart from the disclosed examples and can find utility in other implementations not expressly disclosed herein.

To the extent that terms "includes," "including," "has," "contains," and variants thereof are used herein, such terms are intended to be inclusive in a manner similar to the term "comprises" as an open transition word without precluding any additional or other elements.

It will be appreciated that "and/or" as used herein refers to the logical disjunction operation, and thus A and/or B has the following truth table.

| A | B | A and/or B |
|---|---|---|
| T | T | T |
| T | F | T |
| F | T | T |
| F | F | F |

Further, the disclosure comprises configurations according to the following clauses.

Clause 1. An image generation system for unsupervised cross-domain image generation relative to a first image domain and a second image domain, the image generation system comprising: a processor, and a memory storing instructions that, when executed by the processor, cause the system to: receive a 3D CAD (computer aided design) model comprising 3D model images of a target object; based on the 3D CAD model of the target object, generate a plurality of augmented CAD models of the target object comprising a plurality of data sets, each data set respectively corresponding to an associated one of a plurality of attribute classes, each data set comprising a plurality of 2D model images; input the plurality of data sets into a generative adversarial network comprising a plurality of generators respectively corresponding to the plurality of attribute classes and a plurality of discriminators respectively corresponding to the plurality of generators; generate synthetic photorealistic images of the target object using the plurality of generators, the synthetic photorealistic images including attributes in accordance with the plurality of data sets corresponding to the plurality of attribute classes; and output the synthetic photorealistic images of the target object.

Clause 2. The image generation system of clause 1, wherein, for each of the plurality of attribute classes, the generative adversarial network comprises: a generator comprising: a first image generator configured to generate synthetic images having a similar appearance to one or more of the photorealistic images in the second image domain while including a semantic content of one or more 2D model images in the first image domain, and a second image generator configured to generate synthetic images having a similar appearance to one or more of the 2D model images in the first image domain while including a semantic content of one or more photorealistic images in the second image domain; and a discriminator comprising: a first discriminator configured to discriminate photorealistic images in the second image domain against synthetic photorealistic images generated by the first image generator; and a second discriminator configured to discriminate 2D model images in the first image domain against synthetic 2D model images generated by the second image generator.

Clause 3. The image generation system of clause 1 or 2, wherein the plurality of attribute classes include at least one of an anomaly class, a material textures class, an environmental conditions class, or a perspective views class.

Clause 4. The image generation system of clause 3, wherein one of the attribute classes is the anomaly class; one of the plurality of generators is an anomaly class generator including: a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object; a second image generator configured to generate synthetic images having a similar appearance to one or more of the 2D model images depicting anomalies in the first image domain while including semantic content of one or more photorealistic images in the second image domain; and the discriminator is an anomaly class discriminator including: a first image discriminator configured to discriminate real photorealistic images in the second image domain against synthetic photorealistic images generated by the first image generator; and a second image discriminator configured to discriminate real 2D model images depicting anomalies in the first image domain against synthetic 2D model images depicting anomalies generated by the second image generator, Clause 5. The image generation system of any of clause 1 to 4, wherein the processor is configured to generate the plurality of augmented CAD models by: adding various anomalies into the 3D CAD model augmented in accordance with anomaly instructions; and rendering 2D model images of an anomaly class data set of the anomaly class using the augmented 3D CAD model.

Clause 6. The image generation system of any of clauses 1 to 5, wherein one of the attribute classes is the material textures class; one of the plurality of generators is a material textures class generator including: a first image generator configured to generate synthetic images having a similar appearance to one or more of the photorealistic images in the second image domain while including a semantic content of one or more 2D model images depicting materials and/or textures in the first image domain in accordance with a material textures class data set in the augmented CAD models of the target object; a second image generator configured to generate synthetic images having a similar appearance to one or more of the 2D model images depicting materials and/or textures in the first image domain while including semantic content of one or more photorealistic images in the second image domain; and the discriminator is a material textures class discriminator including: a first image discriminator configured to discriminate real photorealistic images in the second image domain against synthetic photorealistic images generated by the first image generator; and a second image discriminator configured to discriminate real 2D model images depicting materials and/or textures in the first image domain against synthetic 2D model images depicting materials and/or textures generated by the second image generator.

Clause 7. The image generation system of any of clauses 1 to 6, wherein one of the attribute classes is the environmental conditions class; one of the plurality of generators is an environmental conditions class generator including: a first image generator configured to generate synthetic images having a similar appearance to one or more of the photorealistic images in the second image domain while including a semantic content of one or more 2D model images depicting environmental conditions in the first image domain in accordance with an environmental conditions class data set in the augmented CAD models of the target object; a second image generator configured to generate synthetic images having a similar appearance to one or more of the 2D model images depicting environmental conditions in the first image domain while including semantic content of one or more photorealistic images in the second image domain; and the discriminator is an environmental conditions class discriminator including: a first image discriminator configured to discriminate real photorealistic images in the second image domain against synthetic photorealistic images generated by the first image generator; and a second image discriminator configured to discriminate real 2D model images depicting environmental conditions in the first image domain against synthetic 2D model images depicting environmental conditions generated by the second image generator.

Clause 8. The image generation system of any of clauses 1 to 7, wherein one of the attribute classes is the perspective views class; one of the plurality of generators is a perspective views class generator including: a first image generator configured to generate synthetic images having a similar appearance to one or more of the photorealistic images in the second image domain while including a semantic content of one or more 2D model images depicting different perspective views of the target object in the first image domain in accordance with a perspective views class data set in the augmented CAD models of the target object; a second image generator configured to generate synthetic images having a similar appearance to one or more of the 2D model images depicting different perspective views of the target object in the first image domain while including semantic content of one or more photorealistic images in the second image domain; and the discriminator is an perspective views class discriminator including: a first image discriminator configured to discriminate real photorealistic images in the second image domain against synthetic photorealistic images generated by the first image generator; and a second image discriminator configured to discriminate real 2D model images depicting different perspective views of the target object in the first image domain against synthetic 2D model images depicting different perspective views of the target object generated by the second image generator.

Clause 9. The image generation system of any of clauses 1 to 8, wherein the processor is configured to generate the plurality of augmented CAD models by: taking 2D model images of the 3D CAD model from various perspective views augmented in accordance with perspective views instructions; and rendering 2D model images of a perspective views class data set of the perspective views class using the augmented 3D CAD model.

Clause 10. The image generation system of any of clauses 1 to 9, wherein the processor is configured to generate at least one of the plurality of data sets as a plurality of 2D model images comprising a plurality of 2D pixelated images.

Clause 11. An image generation method for unsupervised cross-domain image generation relative to a first image domain and a second image domain, the image generation method comprising: receiving a 3D CAD (computer aided design) model comprising 3D model images of a target object; based on the 3D CAD model of the target object, generating a plurality of augmented CAD models of the target object comprising a plurality of data sets, each data set respectively corresponding to an associated one of a plurality of attribute classes, each data set comprising a plurality of 2D model images; inputting the plurality of data sets into a generative adversarial network comprising a plurality of generators respectively corresponding to the plurality of attribute classes and a plurality of discriminators respectively corresponding to the plurality of generators; generating synthetic photorealistic images of the target object using the plurality of generators, the synthetic photorealistic images including attributes in accordance with the plurality of data sets corresponding to the plurality of attribute classes; and outputting the synthetic photorealistic images of the target object.

Clause 12. The image generation method of clause 11, wherein, for each of the plurality of attribute classes, the generative adversarial network comprises: a generator comprising: a first image generator configured to generate synthetic images having a similar appearance to one or more of the photorealistic images in the second image domain while including a semantic content of one or more 2D model images in the first image domain, and a second image generator configured to generate synthetic images having a similar appearance to one or more of the 2D model images in the first image domain while including a semantic content of one or more photorealistic images in the second image domain; and a discriminator comprising: a first discriminator configured to discriminate photorealistic images in the second image domain against synthetic photorealistic images generated by the first image generator; and a second discriminator configured to discriminate 2D model images in the first image domain against synthetic 2D model images generated by the second image generator.

Clause 13. The image generation method of clause 11 or 12, wherein the plurality of attribute classes include at least one of an anomaly class, a material textures class, an environmental conditions class, or a perspective views class.

Clause 14. The image generation method of any of clauses 11 to 13, wherein one of the attribute classes is the anomaly class; one of the plurality of generators is an anomaly class generator including: a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object; a second image generator configured to generate synthetic images having a similar appearance to one or more of the 2D model images depicting anomalies in the first image domain while including semantic content of one or more photorealistic images in the second image domain; and the discriminator is an anomaly class discriminator including: a first image discriminator configured to discriminate real photorealistic images in the second image domain against synthetic photorealistic images generated by the first image generator; and a second image discriminator configured to discriminate real 2D model images depicting anomalies in the first image domain against synthetic 2D model images depicting anomalies generated by the second image generator.

Clause 15. The image generation method of any of clauses 11 to 14, wherein one of the attribute classes is the material textures class; one of the plurality of generators is a material textures class generator including: a first image generator configured to generate synthetic images having a similar appearance to one or more of the photorealistic images in the second image domain while including a semantic content of one or more 2D model images depicting materials and/or textures in the first image domain in accordance with a material textures class data set in the augmented CAD models of the target object; a second image generator configured to generate synthetic images having a similar appearance to one or more of the 2D model images depicting materials and/or textures in the first image domain while including semantic content of one or more photorealistic images in the second image domain; and the discriminator is a material textures class discriminator including: a first image discriminator configured to discriminate real photorealistic images in the second image domain against synthetic photorealistic images generated by the first image generator; and a second image discriminator configured to discriminate real 2D model images depicting materials and/or textures in the first image domain against synthetic 2D model images depicting materials and/or textures generated by the second image generator.

Clause 16. The image generation method of any of clauses 11 to 15, wherein one of the attribute classes is the environmental conditions class; one of the plurality of generators is an environmental conditions class generator including: a first image generator configured to generate synthetic images having a similar appearance to one or more of the photorealistic images in the second image domain while including a semantic content of one or more 2D model images depicting environmental conditions in the first image domain in accordance with an environmental conditions class data set in the augmented CAD models of the target object; a second image generator configured to generate synthetic images having a similar appearance to one or more of the 2D model images depicting environmental conditions in the first image domain while including semantic content of one or more photorealistic images in the second image domain; and the discriminator is an environmental conditions class discriminator including: a first image discriminator configured to discriminate real photorealistic images in the second image domain against synthetic photorealistic images generated by the first image generator; and a second image discriminator configured to discriminate real 2D model images depicting environmental conditions in the first image domain against synthetic 2D model images depicting environmental conditions generated by the second image generator.

Clause 17. The image generation method of any of clauses 11 to 16, wherein one of the attribute classes is the perspective views class; one of the plurality of generators is a perspective views class generator including: a first image generator configured to generate synthetic images having a similar appearance to one or more of the photorealistic images in the second image domain while including a semantic content of one or more 2D model images depicting different perspective views of the target object in the first image domain in accordance with a perspective views class data set in the augmented CAD models of the target object; a second image generator configured to generate synthetic images having a similar appearance to one or more of the 2D model images depicting different perspective views of the target object in the first image domain while including semantic content of one or more photorealistic images in the second image domain; and the discriminator is an perspective views class discriminator including: a first image discriminator configured to discriminate real photorealistic images in the second image domain against synthetic photorealistic images generated by the first image generator; and a second image discriminator configured to discriminate real 2D model images depicting different perspective views of the target object in the first image domain against synthetic 2D model images depicting different perspective views of the target object generated by the second image generator.

Clause 18. The image generation method of any of clauses 11 to 17, wherein the plurality of augmented CAD models are generated by: taking 2D model images of the 3D CAD model from various perspective views augmented in accordance with perspective views instructions; and rendering 2D model images of a perspective views class data set of the perspective views class using the augmented 3D CAD model.

Clause 19. The image generation method of any of clauses 11 to 18, wherein at least one of the plurality of data sets is generated as a plurality of 2D model images comprising a plurality of 2D pixelated images.

Clause 20. An image generation system for unsupervised cross-domain image generation relative to a first image domain and a second image domain, the image generation system comprising: a processor, and a memory storing instructions that, when executed by the processor, cause the system to: receive a 3D CAD (computer aided design) model comprising 3D model images of a target object; based on the 3D CAD model of the target object, generate a plurality of augmented CAD models of the target object comprising a plurality of data sets, each data set respectively corresponding to an associated one of a plurality of attribute classes, each data set comprising a plurality of 2D model images; input the plurality of data sets into a generative adversarial network comprising a plurality of generators respectively corresponding to the plurality of attribute classes and a plurality of discriminators respectively corresponding to the plurality of generators; generate synthetic photorealistic images of the target object using the plurality of generators, the synthetic photorealistic images including attributes in accordance with the plurality of data sets corresponding to the plurality of attribute classes; and inputting the synthetic photorealistic images of the target object into an anomaly detection artificial intelligence model to train the anomaly detection artificial intelligence model to detect anomalies on the target object, wherein one of the attribute classes is an anomaly class; one of the plurality of generators is an anomaly class generator including: a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object; a second image generator configured to generate synthetic images having a similar appearance to one or more of the 2D model images depicting anomalies in the first image domain while including semantic content of one or more photorealistic images in the second image domain; the discriminator is an anomaly class discriminator including: a first image discriminator configured to discriminate real photorealistic images in the second image domain against synthetic photorealistic images generated by the first image generator; and a second image discriminator configured to discriminate real 2D model images depicting anomalies in the first image domain against synthetic 2D model images depicting anomalies generated by the second image generator, wherein the plurality of augmented CAD models are generated by: adding various anomalies into the 3D CAD model augmented in accordance with anomaly instructions; and rendering 2D model images of an anomaly class data set of the anomaly class using the augmented 3D CAD model.

The invention claimed is:

1. An image generation system for unsupervised cross-domain image generation relative to a first image domain and a second image domain, the image generation system comprising:
    a processor, and a memory storing instructions that, when executed by the processor, cause the system to:
        receive a 3D CAD (computer aided design) model comprising 3D model images of a target object;
        based on the 3D CAD model of the target object, generate a plurality of augmented CAD models of the target object comprising a plurality of data sets, each data set respectively corresponding to an associated one of a plurality of attribute classes, each data set comprising a plurality of 2D model images;
        input the plurality of data sets into a generative adversarial network comprising a plurality of generators respectively corresponding to the plurality of attribute classes and a plurality of discriminators respectively corresponding to the plurality of generators;
        generate synthetic photorealistic images of the target object using the plurality of generators, the synthetic photorealistic images including attributes in accordance with the plurality of data sets corresponding to the plurality of attribute classes; and
        output the synthetic photorealistic images of the target object, wherein
    the plurality of attribute classes includes an anomaly class; and
    the processor is configured to generate the plurality of augmented CAD models by adding various anomalies into the 3D CAD model augmented in accordance with anomaly instructions.

2. The image generation system of claim 1, wherein, for each of the plurality of attribute classes, the generative adversarial network comprises:
    a generator comprising:
        a first image generator configured to generate synthetic images having a similar appearance to one or more of the photorealistic images in the second image domain while including a semantic content of one or more 2D model images in the first image domain, and
        a second image generator configured to generate synthetic images having a similar appearance to one or more of the 2D model images in the first image domain while including a semantic content of one or more photorealistic images in the second image domain; and
    a discriminator comprising:
        a first discriminator configured to discriminate photorealistic images in the second image domain against synthetic photorealistic images generated by the first image generator; and a second discriminator configured to discriminate 2D model images in the first image domain against synthetic 2D model images generated by the second image generator.

3. The image generation system of claim 1, wherein the plurality of attribute classes include at least one of the anomaly class, a material textures class, an environmental conditions class, or a perspective views class.

4. The image generation system of claim 3, wherein
one of the attribute classes is the anomaly class;
one of the plurality of generators is an anomaly class generator including:
   a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object;
   a second image generator configured to generate synthetic images having a similar appearance to one or more of the 2D model images depicting anomalies in the first image domain while including semantic content of one or more photorealistic images in the second image domain; and
the discriminator is an anomaly class discriminator including:
   a first image discriminator configured to discriminate real photorealistic images in the second image domain against synthetic photorealistic images generated by the first image generator; and
   a second image discriminator configured to discriminate real 2D model images depicting anomalies in the first image domain against synthetic 2D model images depicting anomalies generated by the second image generator.

5. The image generation system of claim 3, wherein
one of the attribute classes is the material textures class;
one of the plurality of generators is a material textures class generator including:
   a first image generator configured to generate synthetic images having a similar appearance to one or more of the photorealistic images in the second image domain while including a semantic content of one or more 2D model images depicting materials and/or textures in the first image domain in accordance with a material textures class data set in the augmented CAD models of the target object;
   a second image generator configured to generate synthetic images having a similar appearance to one or more of the 2D model images depicting materials and/or textures in the first image domain while including semantic content of one or more photorealistic images in the second image domain; and
the discriminator is a material textures class discriminator including:
   a first image discriminator configured to discriminate real photorealistic images in the second image domain against synthetic photorealistic images generated by the first image generator; and
   a second image discriminator configured to discriminate real 2D model images depicting materials and/or textures in the first image domain against synthetic 2D model images depicting materials and/or textures generated by the second image generator.

6. The image generation system of claim 3, wherein
one of the attribute classes is the environmental conditions class;
one of the plurality of generators is an environmental conditions class generator including:
   a first image generator configured to generate synthetic images having a similar appearance to one or more of the photorealistic images in the second image domain while including a semantic content of one or more 2D model images depicting environmental conditions in the first image domain in accordance with an environmental conditions class data set in the augmented CAD models of the target object;
   a second image generator configured to generate synthetic images having a similar appearance to one or more of the 2D model images depicting environmental conditions in the first image domain while including semantic content of one or more photorealistic images in the second image domain; and
the discriminator is an environmental conditions class discriminator including:
   a first image discriminator configured to discriminate real photorealistic images in the second image domain against synthetic photorealistic images generated by the first image generator; and
   a second image discriminator configured to discriminate real 2D model images depicting environmental conditions in the first image domain against synthetic 2D model images depicting environmental conditions generated by the second image generator.

7. The image generation system of claim 3, wherein
one of the attribute classes is the perspective views class;
one of the plurality of generators is a perspective views class generator including:
   a first image generator configured to generate synthetic images having a similar appearance to one or more of the photorealistic images in the second image domain while including a semantic content of one or more 2D model images depicting different perspective views of the target object in the first image domain in accordance with a perspective views class data set in the augmented CAD models of the target object;
   a second image generator configured to generate synthetic images having a similar appearance to one or more of the 2D model images depicting different perspective views of the target object in the first image domain while including semantic content of one or more photorealistic images in the second image domain; and
the discriminator is an perspective views class discriminator including:
   a first image discriminator configured to discriminate real photorealistic images in the second image domain against synthetic photorealistic images generated by the first image generator; and
   a second image discriminator configured to discriminate real 2D model images depicting different perspective views of the target object in the first image domain against synthetic 2D model images depicting different perspective views of the target object generated by the second image generator.

8. The image generation system of claim 3, wherein the processor is configured to generate the plurality of augmented CAD models by:
taking 2D model images of the 3D CAD model from various perspective views augmented in accordance with perspective views instructions; and rendering 2D model images of a perspective views class data set of the perspective views class using the augmented 3D CAD model.

9. The image generation system of claim 1, wherein the processor is configured to generate at least one of the plurality of data sets as a plurality of 2D model images comprising a plurality of 2D pixelated images.

10. An image generation method for unsupervised cross-domain image generation relative to a first image domain and a second image domain, the image generation method comprising:
receiving a 3D CAD (computer aided design) model comprising 3D model images of a target object;
based on the 3D CAD model of the target object, generating a plurality of augmented CAD models of the target object comprising a plurality of data sets, each data set respectively corresponding to an associated one of a plurality of attribute classes, each data set comprising a plurality of 2D model images;
inputting the plurality of data sets into a generative adversarial network comprising a plurality of generators respectively corresponding to the plurality of attribute classes and a plurality of discriminators respectively corresponding to the plurality of generators;
generating synthetic photorealistic images of the target object using the plurality of generators, the synthetic photorealistic images including attributes in accordance with the plurality of data sets corresponding to the plurality of attribute classes; and
outputting the synthetic photorealistic images of the target object, wherein
the plurality of attribute classes includes an anomaly class; and
the plurality of augmented CAD models are generated by adding various anomalies into the 3D CAD model augmented in accordance with anomaly instructions.

11. The image generation method of claim 10, wherein, for each of the plurality of attribute classes, the generative adversarial network comprises:
a generator comprising:
a first image generator configured to generate synthetic images having a similar appearance to one or more of the photorealistic images in the second image domain while including a semantic content of one or more 2D model images in the first image domain, and
a second image generator configured to generate synthetic images having a similar appearance to one or more of the 2D model images in the first image domain while including a semantic content of one or more photorealistic images in the second image domain; and
a discriminator comprising:
a first discriminator configured to discriminate photorealistic images in the second image domain against synthetic photorealistic images generated by the first image generator; and
a second discriminator configured to discriminate 2D model images in the first image domain against synthetic 2D model images generated by the second image generator.

12. The image generation method of claim 10, wherein the plurality of attribute classes include at least one of the anomaly class, a material textures class, an environmental conditions class, or a perspective views class.

13. The image generation method of claim 12, wherein one of the attribute classes is the anomaly class;
one of the plurality of generators is an anomaly class generator including:
a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object;
a second image generator configured to generate synthetic images having a similar appearance to one or more of the 2D model images depicting anomalies in the first image domain while including semantic content of one or more photorealistic images in the second image domain; and
the discriminator is an anomaly class discriminator including:
a first image discriminator configured to discriminate real photorealistic images in the second image domain against synthetic photorealistic images generated by the first image generator; and
a second image discriminator configured to discriminate real 2D model images depicting anomalies in the first image domain against synthetic 2D model images depicting anomalies generated by the second image generator.

14. The image generation method of claim 12, wherein one of the attribute classes is the material textures class;
one of the plurality of generators is a material textures class generator including:
a first image generator configured to generate synthetic images having a similar appearance to one or more of the photorealistic images in the second image domain while including a semantic content of one or more 2D model images depicting materials and/or textures in the first image domain in accordance with a material textures class data set in the augmented CAD models of the target object;
a second image generator configured to generate synthetic images having a similar appearance to one or more of the 2D model images depicting materials and/or textures in the first image domain while including semantic content of one or more photorealistic images in the second image domain; and
the discriminator is a material textures class discriminator including:
a first image discriminator configured to discriminate real photorealistic images in the second image domain against synthetic photorealistic images generated by the first image generator; and
a second image discriminator configured to discriminate real 2D model images depicting materials and/or textures in the first image domain against synthetic 2D model images depicting materials and/or textures generated by the second image generator.

15. The image generation method of claim 12, wherein one of the attribute classes is the environmental conditions class;
one of the plurality of generators is an environmental conditions class generator including:
a first image generator configured to generate synthetic images having a similar appearance to one or more of the photorealistic images in the second image domain while including a semantic content of one or more 2D model images depicting environmental conditions in the first image domain in accordance with an environmental conditions class data set in the augmented CAD models of the target object;
a second image generator configured to generate synthetic images having a similar appearance to one or more of the 2D model images depicting environmental conditions in the first image domain while including semantic content of one or more photorealistic images in the second image domain; and
the discriminator is an environmental conditions class discriminator including:
a first image discriminator configured to discriminate real photorealistic images in the second image domain against synthetic photorealistic images generated by the first image generator; and
a second image discriminator configured to discriminate real 2D model images depicting environmental conditions in the first image domain against synthetic 2D model images depicting environmental conditions generated by the second image generator.

16. The image generation method of claim 12, wherein one of the attribute classes is the perspective views class; one of the plurality of generators is a perspective views class generator including:
a first image generator configured to generate synthetic images having a similar appearance to one or more of the photorealistic images in the second image domain while including a semantic content of one or more 2D model images depicting different perspective views of the target object in the first image domain in accordance with a perspective views class data set in the augmented CAD models of the target object;
a second image generator configured to generate synthetic images having a similar appearance to one or more of the 2D model images depicting different perspective views of the target object in the first image domain while including semantic content of one or more photorealistic images in the second image domain; and
the discriminator is an perspective views class discriminator including:
a first image discriminator configured to discriminate real photorealistic images in the second image domain against synthetic photorealistic images generated by the first image generator; and
a second image discriminator configured to discriminate real 2D model images depicting different perspective views of the target object in the first image domain against synthetic 2D model images depicting different perspective views of the target object generated by the second image generator.

17. The image generation method of claim 12, wherein the plurality of augmented CAD models are generated by:
taking 2D model images of the 3D CAD model from various perspective views augmented in accordance with perspective views instructions; and
rendering 2D model images of a perspective views class data set of the perspective views class using the augmented 3D CAD model.

18. The image generation method of claim 10, wherein at least one of the plurality of data sets is generated as a plurality of 2D model images comprising a plurality of 2D pixelated images.

19. An image generation system for unsupervised cross-domain image generation relative to a first image domain and a second image domain, the image generation system comprising:
a processor, and a memory storing instructions that, when executed by the processor, cause the system to:
receive a 3D CAD (computer aided design) model comprising 3D model images of a target object;
based on the 3D CAD model of the target object, generate a plurality of augmented CAD models of the target object comprising a plurality of data sets, each data set respectively corresponding to an associated one of a plurality of attribute classes, each data set comprising a plurality of 2D model images;
input the plurality of data sets into a generative adversarial network comprising a plurality of generators respectively corresponding to the plurality of attribute classes and a plurality of discriminators respectively corresponding to the plurality of generators;
generate synthetic photorealistic images of the target object using the plurality of generators, the synthetic photorealistic images including attributes in accordance with the plurality of data sets corresponding to the plurality of attribute classes; and
inputting the synthetic photorealistic images of the target object into an anomaly detection artificial intelligence model to train the anomaly detection artificial intelligence model to detect anomalies on the target object, wherein
one of the attribute classes is an anomaly class;
one of the plurality of generators is an anomaly class generator including:
a first image generator configured to generate synthetic images having a similar appearance to one or more of the photorealistic images in the second image domain while including a semantic content of one or more 2D model images depicting anomalies in the first image domain in accordance with an anomaly class data set in the augmented CAD models of the target object;
a second image generator configured to generate synthetic images having a similar appearance to one or more of the 2D model images depicting anomalies in the first image domain while including semantic content of one or more photorealistic images in the second image domain;
the discriminator is an anomaly class discriminator including:
a first image discriminator configured to discriminate real photorealistic images in the second image domain against synthetic photorealistic images generated by the first image generator; and
a second image discriminator configured to discriminate real 2D model images depicting anomalies in the first image domain against synthetic 2D model images depicting anomalies generated by the second image generator, wherein
the plurality of augmented CAD models are generated by:
adding various anomalies into the 3D CAD model augmented in accordance with anomaly instructions; and
rendering 2D model images of an anomaly class data set of the anomaly class using the augmented 3D CAD model.

20. The image generation system of claim 1, wherein the synthetic photorealistic images are generated using image-to-image translation from the plurality of 2D model images of each data set.

* * * * *